United States Patent
King et al.

(10) Patent No.: US 7,190,050 B2
(45) Date of Patent: Mar. 13, 2007

(54) INTEGRATED CIRCUIT ON CORRUGATED SUBSTRATE

(75) Inventors: Tsu-Jae King, Fremont, CA (US); Victor Moroz, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 11/173,231

(22) Filed: Jul. 1, 2005

(65) Prior Publication Data
US 2007/0001232 A1    Jan. 4, 2007

(51) Int. Cl.
    *H01L 29/06* (2006.01)
(52) U.S. Cl. .............. 257/622; 257/627; 257/E27.07; 257/401; 438/974
(58) Field of Classification Search ............ 257/622, 257/623, 620; 256/622
    See application file for complete search history.

(56) References Cited

U.S. PATENT DOCUMENTS

| | | | |
|---|---|---|---|
| 6,706,571 B1* | 3/2004 | Yu et al. ................ | 438/157 |
| 6,812,508 B2* | 11/2004 | Fukumi ................ | 257/244 |
| 2004/0099925 A1* | 5/2004 | Poveda ................ | 257/622 |
| 2004/0108559 A1* | 6/2004 | Sugii et al. ............ | 257/411 |
| 2005/0023569 A1 | 2/2005 | Yang | |
| 2005/0056892 A1* | 3/2005 | Seliskar ................ | 257/348 |
| 2005/0202604 A1* | 9/2005 | Cheng et al. .......... | 438/151 |
| 2005/0224800 A1* | 10/2005 | Lindert et al. ........ | 257/66 |
| 2005/0224875 A1* | 10/2005 | Anderson et al. ...... | 257/347 |
| 2005/0224890 A1* | 10/2005 | Bernstein et al. ...... | 257/371 |
| 2005/0239254 A1 | 10/2005 | Chi et al. | |
| 2005/0285186 A1* | 12/2005 | Fujiwara ................ | 257/327 |

* cited by examiner

Primary Examiner—Jerome Jackson
Assistant Examiner—Paul Budd
(74) Attorney, Agent, or Firm—Bever, Hoffman & Harms, LLP; Jeanette S. Harms

(57) ABSTRACT

By forming MOSFETs on a substrate having pre-existing ridges of semiconductor material (i.e., a "corrugated substrate"), the resolution limitations associated with conventional semiconductor manufacturing processes can be overcome, and high-performance, low-power transistors can be reliably and repeatably produced. Forming a corrugated substrate prior to actual device formation allows the ridges on the corrugated substrate to be created using high precision techniques that are not ordinarily suitable for device production. MOSFETs that subsequently incorporate the high-precision ridges into their channel regions will typically exhibit much more precise and less variable performance than similar MOSFETs formed using optical lithography-based techniques that cannot provide the same degree of patterning accuracy. Additional performance enhancement techniques such as pulse-shaped doping and "wrapped" gates can be used in conjunction with the segmented channel regions to further enhance device performance.

14 Claims, 19 Drawing Sheets

INTEGRATED CIRCUIT ON CORRUGATED SUBSTRATE

BACKGROUND OF THE INVENTION

1. Field of the Invention

The invention relates to the field of semiconductor integrated-circuit devices and manufacturing, and in particular to structures for enhancing miniature transistor manufacturability and performance.

2. Related Art

Semiconductor integrated-circuit (IC) manufacturers face growing challenges to accurately and reliably produce ever-smaller transistors in order to improve the cost and performance (speed and/or functionality) of modern electronic devices. The most basic building block used in a digital IC device is the metal-oxide-semiconductor field effect transistor (MOSFET). As MOSFETs are scaled below 100 nm in minimum lateral dimension (i.e., the minimum feature size such as the gate length is less than 100 nm), size-related performance and manufacturing issues become increasingly significant.

For example, the short gate lengths in modern MOSFETs can result in relatively large source-to-drain leakage currents. Such leakage currents can cause ICs incorporating those MOSFETs to exhibit undesirably large static power consumption. Conventional efforts to suppress source-to-drain leakage current typically involve increasing the net dopant concentration in the channel region (e.g., to a net dopant concentration greater than $10^{18}$ atoms/cm$^3$), increasing gate capacitance, and decreasing the depths of the source and drain junctions adjacent to the channel. A high net dopant concentration in the channel region serves to confine the drain-induced lateral electric field to the drain region, and thereby minimizes the effect of drain bias on the electric potential in the channel region near to the source. At the same time, by increasing the capacitive coupling between the gate electrode and the channel region (e.g., by decreasing the thickness of the gate dielectric), dominant control over the channel potential (i.e., controlling whether the transistor is on or off) is maintained by the gate electrode rather than the drain, thereby allowing the gate-induced electric field to more effectively suppress source-to-drain leakage current. By keeping the depths of the source and drain junctions adjacent to the channel shallower than the length of the channel region, sub-surface leakage currents can be suppressed.

Unfortunately, decreasing the gate dielectric thickness leads to undesirable leakage between the gate electrode and channel region. Furthermore, carrier mobility in the small channel regions of modern MOSFETS can be significantly degraded by high dopant concentration, which results in lower "on-current" for the transistor. The parasitic series resistance of the source and drain regions increases with decreasing junction depth, which also results in lower on-current for the transistor. Therefore, as steps are taken in modern MOSFET designs to reduce static power consumption (i.e., reduce source-to-drain leakage current), overall transistor performance (i.e., on-current) can suffer.

Another problem associated with smaller MOSFET dimensions relates to the sensitivity of device performance to dimensional variation. For devices formed using 180 nm technology generation (and below) processes, relatively small differences in, for example, gate length can result in significant performance differences. However, the IC manufacturing processes used to create those devices (e.g., optical lithography) are unable to provide the device-to-device dimensional consistency required to render such performance differences negligible. Consequently, circuit designers must design for worst-case scenarios to accommodate the wide range of device performance levels, thereby sacrificing overall IC performance to accommodate manufacturability concerns.

Accordingly, it is desirable to provide structures and methods that allow high-performance, low-static-power, and low-variability sub-100 nm MOSFET production.

SUMMARY OF THE INVENTION

Conventional metal-oxide-semiconductor field effect transistor (MOSFET) designs face significant challenges as they are scaled down to improve cost and/or performance with each new generation of technology used to manufacture integrated circuits (ICs). In particular, the techniques used to reduce static power consumption by minimizing source-to-drain leakage current (e.g., increased channel doping, decreased gate-dielectric thickness, and decreased source and drain junction depths) tend to also decrease transistor performance by decreasing the on-current. By forming MOSFETs using a semiconductor substrate having precisely-formed and regularly-spaced stripes (ridges of semiconductor material(s)), both high performance (i.e., high on-current) and low static power consumption (i.e., low source-to-drain leakage current) can be achieved. The stripes enable the formation of segmented channel regions that accommodate a wide range of gate-electrode configuration options and also provide greater performance consistency between devices.

In one embodiment, a MOSFET can include a segmented channel region, in which one or more dimensionally precise ridge(s) of semiconductor material (or materials) connect the source and drain regions. The ridges can themselves be formed on an elevated base region that extends a predetermined height above the adjacent substrate surfaces. An insulating material partially surrounds the ridge(s), so that a top portion ("tip") of each ridge is exposed prior to the formation of the gate stack (i.e. the gate-dielectric and gate-electrode layers). A gate electrode (and interposing gate-dielectric layer(s)) for each ridge is formed over the exposed tips of the ridges and "wraps" around those tips to provide enhanced control over source-to-drain leakage currents. (The gate electrode "straddles" the top portion of each ridge.) Heavily doped sub-surface regions within the ridges that begin at or near to the bottom of the tip (corresponding to the level of the insulating material) serve to further reduce source-to-drain leakage currents, thereby minimizing the static power consumption of the transistor. According to various other embodiments, any on-current enhancement or leakage-current reduction techniques applicable to conventional MOSFET constructions can also be applied.

In another embodiment, an IC (and method for producing the IC) incorporates multiple MOSFETs formed on pre-existing ridges on a corrugated substrate. Since the ridges on the corrugated substrate are geometrically very simple and very regular, high-precision fabrication techniques (e.g., imprint lithography or spacer lithography) can be used that would normally be impractical for actual device production. Once the corrugated substrate is available, the ridges on the substrate can be patterned based on the desired functional regions for the IC (i.e., by removing the ridges in the non-functional regions), and then forming an insulation layer around and between the functional regions. Gate dielectric layer(s) and gate electrodes can then be formed over the ridges in the desired transistor locations, and various doping operations can be performed to define the source, drain, and channel regions for the MOSFETs. The IC formed in this manner will include MOSFETs having channel regions formed by one or more of the ridges, which helps to ensure that the MOSFETs exhibit accurate and consistent performance from device to device. Adjacent MOSFETs in the IC (in the direction of the original ridges) can have precisely aligned channel region semiconductor segments, because those segments were originally formed from continuous ridges (i.e., the pre-existing ridges on the corrugated substrate). In various embodiments, the MOSFETs can include various source-to-drain leakage current reduction techniques such as heavily doped sub-surface regions in channel regions and wrapped gates (i.e., gates that wrap around the top portions of the ridges in the channel regions). In another embodiment, ridges in a pattern between two transistor locations can be filled in with electrically conductive material to form an electrical interconnect between the two transistor locations, thereby reducing metallization requirements.

A semiconductor wafer can include one or more sets of precisely formed ridges, with each set of ridges including parallel ridges having the same height, width, and spacing. In one embodiment, the ridges in a single set of ridges can span the entire wafer. In another embodiment, different sets of ridges can be formed at different locations on the wafer. For example, each die region between scribe lines can have a particular arrangement of ridge sets, with ridges in different sets running in different directions to provide device fabrication flexibility.

The invention will be more fully understood in view of the following description and drawings.

DETAILED DESCRIPTION

Conventional metal-oxide-semiconductor field effect transistor (MOSFET) designs face significant problems as those designs are scaled down to improve the cost and performance of integrated circuits (ICs). In particular, the techniques used to reduce static power consumption by minimizing source-to-drain leakage current (e.g., increased channel doping, decreased gate-dielectric thickness, decreased source and drain junction depths) tend to also decrease transistor performance by decreasing on-current. By forming MOSFETs over a substrate having precisely-formed and regularly-spaced stripes (ridges of semiconductor material(s)), both high performance (i.e., high on-current) and low static power consumption (i.e., low source-to-drain leakage current) can be achieved with good uniformity. The stripes enable the formation of segmented channel regions that accommodate a wide range of gate-electrode configuration options and also provide greater performance consistency between devices.

Figure 1A:
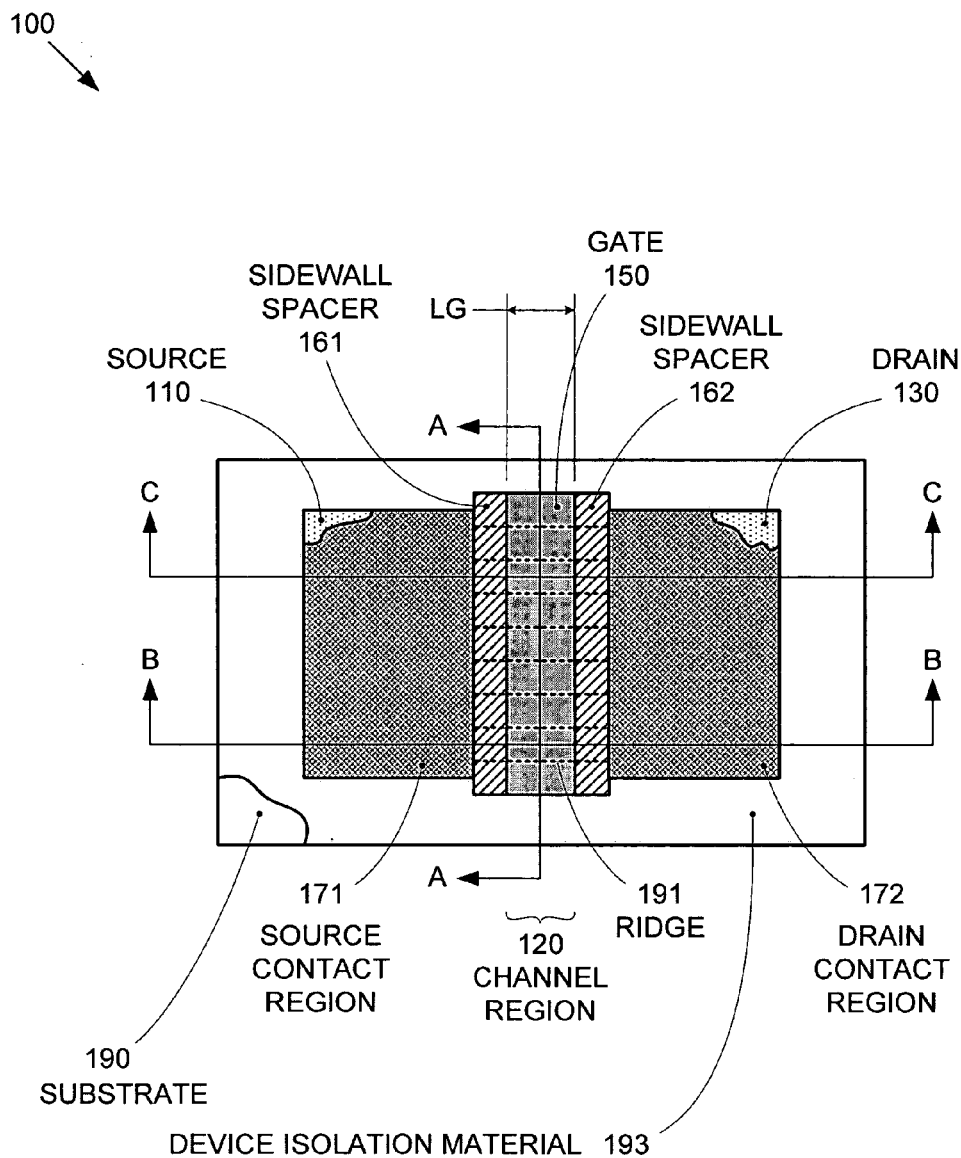
FIGS. 1A, 1B, 1C, 1D, 1E, 1F, 1G, and 1H are various views of a transistor including a segmented channel region.

FIG. 1A shows a top view of an exemplary transistor 100 that includes a segmented channel region. Transistor 100 is formed on a substrate 190 and is surrounded by device isolation material 193 (e.g., shallow trench isolation), and includes a source 110, a drain 130, a gate 150, sidewall spacers 161 and 162, a source contact region 171, and a drain contact region 172. Gate 150 (with a gate length LG) is located between source 110 and drain 130 and is formed over a channel region 120 in substrate 190. In various embodiments, gate 150 can be formed from any semiconductor/conductor material, including doped silicon, doped silicon-germanium alloy, undoped or doped silicide, undoped or doped germanosilicide, metal, metal-nitride, conductive metal-oxide, or any combination of layers of these materials, among others. Sidewall spacers 161 and 162 lie over at least a portion of source 110 and drain 130, respectively, and serve to offset the gate 150 from source contact region 171 and drain contact region 172, respectively. In various embodiments, source contact region 171 and drain contact region 172 may each be comprised in part of a metal-semiconductor compound such as silicide, germanide, or germanosilicide.

Figure 1B:
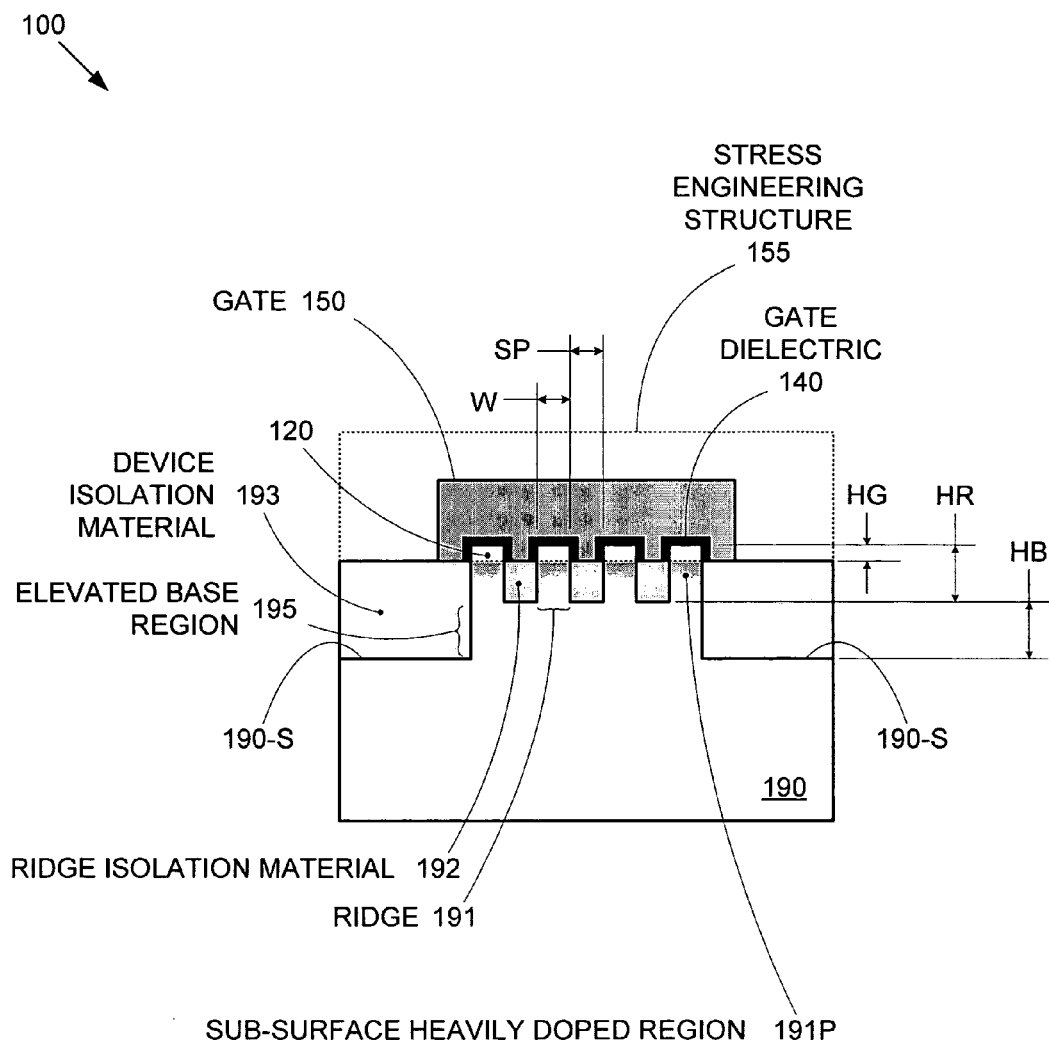

As indicated by the dotted lines, channel region 120 includes multiple ridges 191 that run between source 110 and drain 130. Ridges 191 are formed from at least one semiconductor material and may be homogenous structures (e.g., silicon, silicon-germanium alloy, germanium, silicon-carbon alloy, compound semiconductor materials, or aligned carbon nanotubes) or may have layers of different materials (e.g., a silicon layer on a dielectric layer or a silicon layer on a silicon-germanium layer). Ridges 191 are formed on an elevated base region 195 that rises from substrate 190, as shown in FIG. 1B. FIG. 1B is a cross-sectional view of transistor 100 through view location A—A (rotated 90° for clarity). Each ridge 191 has a width W, and is spaced from adjacent ridges by a spacing SP. Furthermore, each ridge 191 extends a height HR above elevated base region 195, which itself rises a height HB from the adjacent surfaces 190-S of substrate 190.

Note that while four ridges 191 are depicted for exemplary purposes, transistor 100 can include any number of ridges 191, and that the particular sizing, spacing, and quantity of ridges 191 (and also of elevated base region 195) included in transistor 100 is determined by the desired properties of transistor 100. Note further that because ridges 191 are identified relative to substrate 190, ridges 191 continue to exist as "ridges" even covered with other materials (e.g., even though ridge isolation material 192, device isolation material 193, gate dielectrics 140, and gate 150 completely cover ridges 191, ridges 191 are still considered to be ridges.)

In addition, while depicted as homogenous extensions of elevated base region 195 (and hence substrate 190) for exemplary purposes, ridges 191 can comprise any construction (e.g., as described in greater detail below, each of ridges 191 can include multiple layers of different semiconductor or semiconductor and dielectric materials) and may even be formed from a different material(s) than elevated base region 195 and/or substrate 190. As described in greater detail below, each of ridges 191 is a highly precise structure that therefore provides highly quantifiable performance measures. Therefore, achieving a desired performance for transistor 100 simply entails incorporating an appropriate number of ridges 191 (e.g., if each ridge provides 0.1 mA of on-current and the desired on-current for transistor 100 must be at least 0.5 mA, five ridges 191 can be included in transistor 100).

Transistor 100 is isolated from adjacent devices by device isolation material 193 (e.g., silicon dioxide, silicon nitride, or any other dielectric material(s)), which extends down to surfaces 190-S of substrate 190 (i.e., down to the bottom of elevated base region 195). Ridge isolation material 192 (which can be formed from the same material(s) or different material(s) than device isolation material 193) fills the inter-ridge regions to a distance HG below the top of ridges 191. Gate 150 is formed over the top portions of ridges 191, separated from those top portions by gate dielectric 140 (which can be formed from any dielectric material(s), including silicon dioxide, silicon oxynitride, silicon nitride, hafnium dioxide, hafnium silicate, $HfSiO_xN_y$, $HfAlO_xN_y$, $HfAlO_x$, zirconium dioxide, zirconium silicate, or other high-permittivity dielectric, or any combination of layers of these materials, among others). Thus, when appropriate voltages are applied to gate 150 and between source 110 and drain 130, each of ridges 191 conducts a portion of the total on-current that flows through transistor 100.

Note that gate dielectric 140 and gate 150 "wrap" around the top portions of ridges 191 (i.e., gate dielectric 140 and gate 150 extend down the sides of ridges 191 by recess distance HG). This wrapping configuration allows gate 150 to more effectively control the electric potential distribution within channel region 120, and can therefore enhance on-current while minimizing source-to-drain leakage current. To further enhance performance, each ridge 190 can include a sub-surface heavily doped region 191P that provides a region of high dopant concentration below the top surface of each ridge (as described in greater detail below).

Note further that in various other embodiments, ridges 191 can exhibit a multilayered construction (i.e., two or more layers of different materials). For example, each ridge 191 may include a semiconductor layer formed over a dielectric layer (e.g., to reduce body leakage). Each ridge 191 may also include multiple layers of semiconductor materials (e.g., to induce a desired stress within channel region 120). In addition, transistor 100 may include any other type of stress engineering structures, as indicated by optional stress engineering structure 155 (indicated by a dotted line). For example, stress engineering structure 155 could be a stressed capping layer formed over source 110, drain 130, and gate 150 (and any intermediate structures such as sidewall spacers 161 and 162 shown in FIG. 1A) to induce a desired compressive or tensile stress within channel 120 in each ridge 191 for enhancing carrier mobility.

Figure 1C:
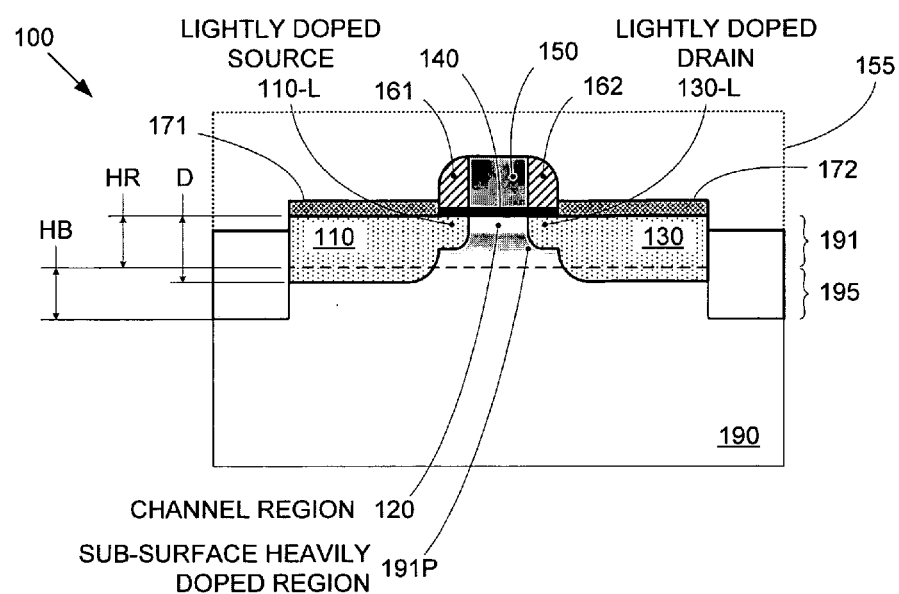

FIG. 1C shows a cross-sectional view of transistor 100 through view location B—B indicated in FIG. 1A. View location B—B provides a cross-sectional view running parallel to the direction of current flow between source 110 and drain 130 and through one of ridges 191, and therefore indicates the full doping profiles in and around channel region 120. As indicated in FIG. 1C, source 110 and drain 130 are doped regions within ridge 191. Note that source 110 and drain 130 can be formed in portions of transistor 100 that may originally have been discrete ridges (i.e., continuous with ridges 191 in channel region 120) but were subsequently filled (as described in greater detail below) to provide large planar source contact region 171 and drain contact region 172, respectively, for the landing of metallic interconnects in these regions.

Note further that source 110 and drain 130 can optionally include shallow extensions such as lightly doped source 110-L and lightly doped drain 130-L, respectively, to reduce short-channel and hot-carrier effects. Typically, source and/or drain extensions such as lightly doped source 110-L and lightly doped drain 130-L are formed by performing a shallow ion implant operation after the formation of gate 150. Sidewall spacers 161 and 162 are then formed on each side of gate 150, and a subsequent higher-dose, deeper implant operation is performed. Sidewall spacers 161 and 162 (which can be formed from any dielectric material(s), including silicon dioxide, silicon oxynitride, silicon nitride, hafnium dioxide, hafnium silicate, $HfSiO_xN_y$, $HfAlO_xN_y$, $HfAlO_x$, zirconium dioxide, zirconium silicate, or other high-permittivity dielectric, or any combination of layers of these materials, among others) block dopant penetration into the semiconductor, thereby allowing lightly doped source 110-L and lightly doped drain 130-L, respectively, to remain as discrete shallow extensions after this second implant operation. Note that if corrugated substrate is an SOI substrate (e.g., with ridges 191 formed on an insulation layer), or if ridges 191 themselves include an insulating layer, the heavily doped regions of source 110 and drain 130 might not be deeper than lightly doped source 110-L and lightly doped drain 130-L, respectively.

Note further that in various other embodiments, lightly doped source 110-L and lightly doped drain 130-L (and/or source 110 and drain 130) may be formed from material(s) other than doped semiconductor material. For example, to reduce parasitic series resistance, lightly doped source 110-L and lightly doped drain 130-L (and/or some or all of source 110 and drain 130) may be formed from a metal-semiconductor compound (e.g., silicide, germanide, or germanosilicide, among others). In one embodiment, the regions of source 110 and drain 130 could be either undoped or doped prior to metal-semiconductor compound formation, so that the metal-semiconductor compound material formed in those regions may be undoped or doped, respectively.

Note also that in various other embodiments, transistor 100 may not include sidewall spacers 161 and 162 and/or lightly doped source 110-L and lightly doped drain 130-L. Note further that lightly doped source 110-L and/or lightly doped drain 130-L may or may not extend underneath the edges of gate 150. Note further that due to the enhanced gate control provided by the "wrapped" gate 150, in various other embodiments, the source and drain extensions may be eliminated, so that both source 110 and drain 130 may be implemented as singly doped regions. Note further that while depicted as extending below the bottom of ridges 191 for exemplary purposes, the depth D of source 110 and drain 130 below the surface of ridge 191 can alternatively be less than the overall height HR of ridge 191 (i.e., depth D is less than ridge height HR), so that ridge isolation material 192 (shown in FIG. 1B), which starts from the base of ridge 191, can effectively reduce the area of the junction between the source 110 and substrate 190, and the area of the junction between the drain 130 and substrate 190, thereby reducing junction leakage and capacitance.

Note further that while ridge 191 is depicted as a homogenous structure extending from elevated base region 195 for exemplary purposes, ridge 191 can exhibit any compositional structure. As noted above with respect to FIG. 1B, ridge 191 could exhibit a multilayered structure that includes at least one layer of a semiconductor material. In other embodiments, ridge 191 could exhibit laterally changing material compositions. For example, channel region 120 (and the portion of ridge 191 below channel region 120) could exhibit different semiconductor material(s) and/or construction from the surrounding portions of ridge 191 (e.g., ridge 191 could include a dielectric region only under channel 120).

Figure 1D:
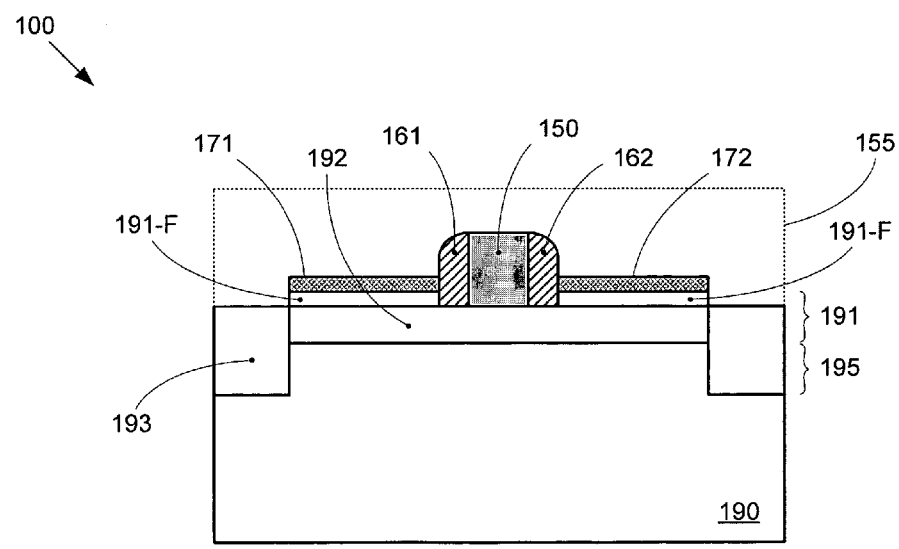

FIG. 1D shows a cross-sectional view of transistor 100 through view location C—C indicated in FIG. 1A. View location C—C runs between two ridges 191, parallel to the direction of current flow between source 110 and drain 130. Therefore, FIG. 1D depicts gate 150 (and sidewall spacers 161 and 162) extending down below the top surface of ridge 191. Specifically, gate 150 extends down to the level of ridge isolation material 192. Note that because view location C—C runs between ridges 191, the portions of source 110 and drain 130 on either side of gate 150 (and sidewall spacers 161 and 162, if present) are actually fill regions 191-F (i.e., regions formed by filling the space between the exposed portions of adjacent ridges 191, as described in greater detail below).

As noted above, the conventional method of reducing source-to-drain leakage current by increasing channel doping has the undesirable side effect of reducing channel carrier mobility, thereby reducing overall on-current. Therefore, alternative approaches have been developed to take advantage of the fact that the bulk of source-to-drain leakage current occurs in regions where the electric field induced by the gate is limited, i.e., in the portion of the channel furthest from the gate. One approach to eliminate this leakage path is to use a steep retrograde channel doping profile, such as the "pulse-shaped doping" described in "Scaling the Si MOSFET: From Bulk to SOI to Bulk", by Ran-Hong Yan et al., *IEEE Transactions On Electron Devices*, vol. 39. no. 7, JULY 1992. In the pulse-shaped doping approach, a heavily doped region is formed at some distance beneath the surface of a substrate (for example, by performing a high-energy ion implant operation, in which the implanted ions all penetrate to at least a desired depth below the surface). The dopant concentration profile created in this manner starts off low at the top surface of the substrate, then jumps to a high dopant concentration (the "pulse") at a desired distance below the surface, and then eventually falls back to a lower concentration. Note that in various other embodiments, the sub-surface heavy doping provided by the retrograde-doped region 191P can extend to any depth, and can even extend into the bulk substrate region of substrate 190 (i.e., below the bases of ridges 191), though it is preferable for the heavily-doped region 191P to not extend past the depth of source 110 and drain 130 in order to minimize junction capacitance and junction leakage current.

By combining appropriately positioned retrograde channel doping (as indicated by sub-surface heavily doped region 191P in FIGS. 1B and 1C) with the segmented channel construction of transistor 100, a low source-to-drain leakage current can be achieved while still providing relatively high on-current performance.

Note that the change in doping concentration provided by sub-surface heavily doped region 191P will be relatively abrupt, but will generally not be a precise step function. Instead, the dopant concentration will exhibit a relatively sharp gradient from the low dopant concentration channel region 120 to the high dopant concentration of retrograde doped region 191P. For explanatory purposes, the boundary of sub-surface heavily doped region 191P (i.e., the bottom of undoped or lightly doped channel region 120) can be considered to be the location at which the dopant concentration reaches 50% of the maximum dopant concentration in sub-surface heavily doped region 191P.

As depicted in FIG. 1B, heavily doped regions 191P are ideally located such that the undoped or lightly doped channel region 120 in each ridge 191 corresponds to the overlap R between gate 150 and each ridge 191. In other words, the sub-surface heavily doped region 191P preferably starts at the point where gate 150 ends along each ridge 191 (i.e., at distance HG below the top surface of ridge 191). This design can provide an optimal trade-off between transistor performance and power consumption, since the channel region 120 in each ridge 191 is bounded on three sides by gate 150 to maximize gate control to achieve high on-current, and is bounded by sub-surface heavily doped region 191P just below gate 150 to minimize source-to-drain leakage current. Note, however, that the dopant concentration profile of the sub-surface heavily doped region 191P will typically not be a sharp step function (i.e., the dopant concentration will not abruptly jump to the maximum dopant concentration level). The actual dopant concentration profile of sub-surface heavily doped region 191P will be a roughly exponential or Gaussian increase (until the maximum dopant concentration is reached). Therefore, benefits provided by sub-surface heavily doped region 191P can generally be maximized if the distance from the top surface of ridge 191 at which sub-surface heavily doped region 191P reaches 50% of the maximum dopant concentration is equal to or less than distance HG. Note that the boundary of sub-surface heavily doped region 191P generally should not be located too close to (e.g., less than 5 nm away from) the top surface of ridge 191, however, otherwise the transistor on-state drive current will be degraded. Thus, if distance HG is very small (e.g., less than 5 nm), then sub-surface heavily doped region 191P should start below the point where gate 150 ends along each ridge 191.

Figure 1E:
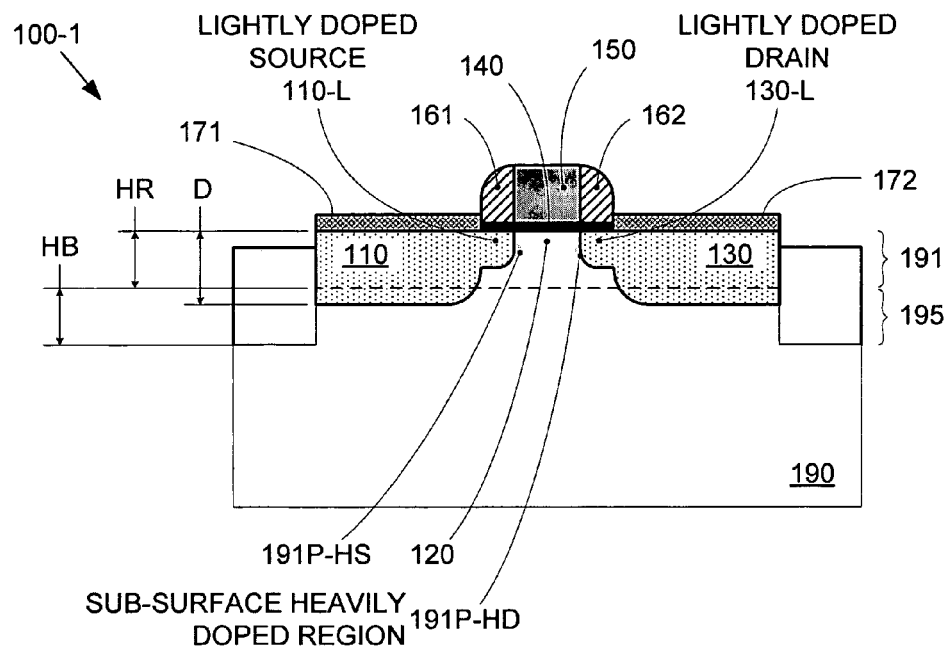
Figure 1F:
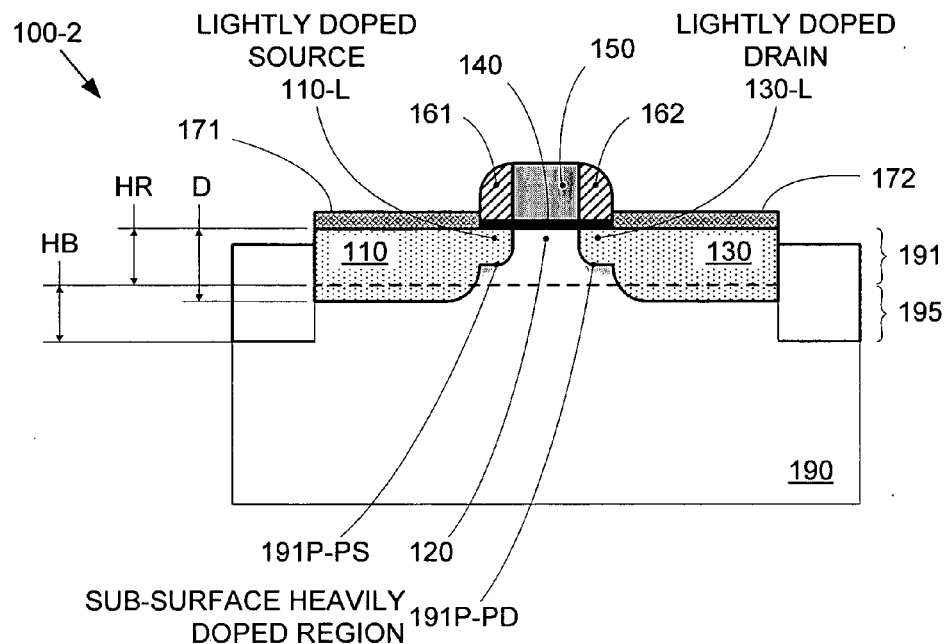

Note that any other techniques for creating sub-surface heavily doped regions can be used. For example, FIG. 1E shows a cross-sectional view of a transistor 100-1 that is substantially similar to transistor 100 described with respect to FIGS. 1A–1D, except that rather than incorporating a retrograde channel doping profile (191P), transistor 100-1 includes sub-surface heavily doped regions 191P-HS and 191P-HD. Sub-surface heavily doped regions 191P-HS and 191P-HD are formed using "halo" doping adjacent to lightly doped source 110-L and lightly doped drain 130-L, respectively. By creating a high dopant concentration at the source and drain extensions, this halo doping can reduce short channel effects, thereby minimizing source-to-drain leakage current. FIG. 1F shows a cross-sectional view of a transistor 100-2 that is substantially similar to transistor 100-1 shown in FIG. 1E, except transistor 100-2 includes sub-surface heavily doped regions 191P-PS and 191P-PD beneath lightly doped source 110-L and lightly doped drain 130-L, respectively. These "pocket" doped regions can provide the same type of leakage current reduction described with respect to sub-surface heavily doped regions 191P-HS and 191P-HD described with respect to FIG. 1E.

Table 1 shows sample data for comparing the performance (on-state drive current and off-state source-to-drain leakage current, each normalized to the transistor layout width) of various n-channel implementations of transistor 100 (rows 1, 2, 3, 4, 5, and 6) against the performance specifications with no carrier mobility enhancement as published in the International Technology Roadmap for Semiconductors (ITRS), 2003 Edition (rows 7 and 8). Each of the implementations of transistor 100 is based on a fundamental set of implementation values, including a single ridge 191 in the channel region, a 20 nm spacing between ridges 191 (i.e., the total layout width of the simulated transistor 100 is the ridge width W plus 20 nm), a thickness for gate dielectric 140 equivalent to 1.2 nm of $SiO_2$, an undoped channel, a heavily p-type doped ($2\times10^{19}$ cm$^{-3}$ boron) pulse doped region starting precisely at the end of the gate overlap (i.e., at a distance HG below the surface of ridge 191), no stress-based mobility enhancement, and singly doped source/drain regions.

TABLE 1

| No. | Description | W (nm) | LG (nm) | HG (nm) | Ion (mA/μm) | Ioff (nA/μm) |
|---|---|---|---|---|---|---|
| 1 | Slightly Recessed | 20 | 20 | 5 | 0.5 | $3 \times 10^{-6}$ |
| 2 | Moderately Recessed | 20 | 20 | 10 | 0.6 | 0.4 |
| 3 | Very Recessed | 20 | 20 | 15 | 0.98 | 500 |
| 4 | Longer Channel | 20 | 40 | 20 | 0.8 | $8 \times 10^{-4}$ |
| 5 | Wider Ridge | 40 | 20 | 10 | 0.82 | 2.2 |
| 6 | "FinFET" | 10 | 20 | 20 | 1.30 | 17 |
| 7 | ITRS High Performance | NA | 20 | NA | 0.8 | 70 |
| 8 | ITRS Low Standby Power | NA | 20 | NA | 0.58 | 0.06 |

As indicated in Table 1, design number 1, which incorporates a ridge width of 20 nm, a gate length of 20 nm, and a recess distance of 5 nm (a "Slight Recess"), provides an on-state drive current $I_{on}$ of 0.5 mA/μm and an off-state source-to-drain leakage current $I_{off}$ of $3\times10^{-6}$ nA/μm. Note that $I_{on}$ and $I_{off}$ are listed in terms of current per micron layout width (in the direction transverse to the direction of current flow) to normalize the current values. Thus, by implementing transistor 100 with just a slight wrapping of gate 150 around ridge 191, a very low off-state leakage current is achieved, but the on-state drive current is somewhat low. Increasing the recess distance HG to 10 nm in design number 2 provides an increase in $I_{on}$ to 0.6 mA/μm, at the trade-off of increasing $I_{off}$ to 0.4 nA/μm. Further increasing recess distance HG to 15 nm in design number 3 provides a significant jump in $I_{on}$ to 0.98 mA/μm, but increases $I_{off}$ to 500 nA/μm. Thus, implementing transistor 100 using values similar to design number 3 would generally be best for high performance circuits, whereas implementing transistor 100 using values similar to design number 1 would be best for ultra-low power circuits.

As indicated by the performance values provided for design numbers 1–3, transistor 100 allows the relationship between on-current $I_{on}$ and off-current $I_{off}$ to be adjusted via recess distance HG, i.e. the depth of the sub-surface heavily doped region 191P. In contrast, the $I_{on}/I_{off}$ relationship in conventional transistors is typically modified by adjusting the doping concentration within the channel region to achieve a particular threshold voltage. Because dimensional control (i.e., control over recess distance HG and the location of sub-surface heavily doped region 191P) can be more precise than dopant concentration control (i.e., control over the number of dopant atoms in the channel region), transistor 100 can significantly ease the difficulties associated with achieving a particular combination of on-current $I_{on}$ and off-current $I_{off}$.

Adjusting other parameters of transistor 100, such as increasing gate length (design number 4, "Longer Channel") or increasing ridge width (design number 5, "Wider Ridge") can provide additional adjustment control over on-current $I_{on}$ and off-current $I_{off}$. Design 6 ("FinFET") approximates a vertical transistor design that has been developed in an effort to overcome the aforementioned limitations of conventional MOSFET transistors. A FinFET incorporates a high aspect ratio structure (fin) extending above the substrate surface that forms the channel region for the transistor. A gate is formed transverse to the fin and down both sides of the fin, thereby providing a "double gate" type of structure (i.e., the gate electrode induces an electric field from both sides of the fin in the channel region). As indicated by the values for design number 6, a FinFET can achieve high on-current $I_{on}$ and a relatively low off-current $I_{off}$. However, the high aspect ratio fin coupled with a deep recess distance (essentially the full height of the fin channel region) can make the FinFET substantially more difficult to manufacture than transistor 100 (which can be formed using standard manufacturing processes as described in greater detail below).

Transistor 100 therefore provides a highly manufacturable structural design that still allows a great deal of performance enhancement and power savings capabilities. Note that the raised construction of ridges 191 can also beneficially minimize stress induced within the channel region of transistor 100 by the insulation material surrounding the device. Material stress can significantly affect the performance of a transistor (both negatively and positively). Therefore, it is desirable to be able to accurately define the stress within the channel region of a transistor. Due to the raised nature of ridges 191, any undesirable stress at the base of ridges 191 will typically be significantly reduced within the top portions of ridges 191 wherein the active region of transistor 100 resides (i.e., from the tips of ridges 191 down to a distance HG). Furthermore, stress within transistor 100 is reduced even more by the fact that ridges 191 are formed on elevated base region 195 that further removes channel region 120 from the regions of highest stress (where device isolation material 193 meets elevated base region 195). Therefore, the elevated, ridged construction of transistor 100 can significantly reduce undesirable stress within transistor 100 (versus conventional transistor designs). In general, beneficial stress relief from and adequate electrical isolation by device isolation material 193 can be provided when the depth of device isolation material 193 below the base of ridges 191 is at least equal to the height of ridges 191 (i.e., elevated base height HB is greater than or equal to ridge height HR). However, optimal stress/electrical isolation may be provided by significantly higher base height/ridge height ratios (e.g., base height HB is equal to 5× ridge height HR). Note also that since ridges 191 can be defined and manufactured with a high degree of precision (as described in greater detail below), beneficial stress within each ridge 191 can be accurately induced (e.g., by forming ridges 191 as silicon on silicon-germanium stacks) to allow transistor 100 to achieve a desired performance simply by incorporating an appropriate number of ridges 191.

Figure 1G:
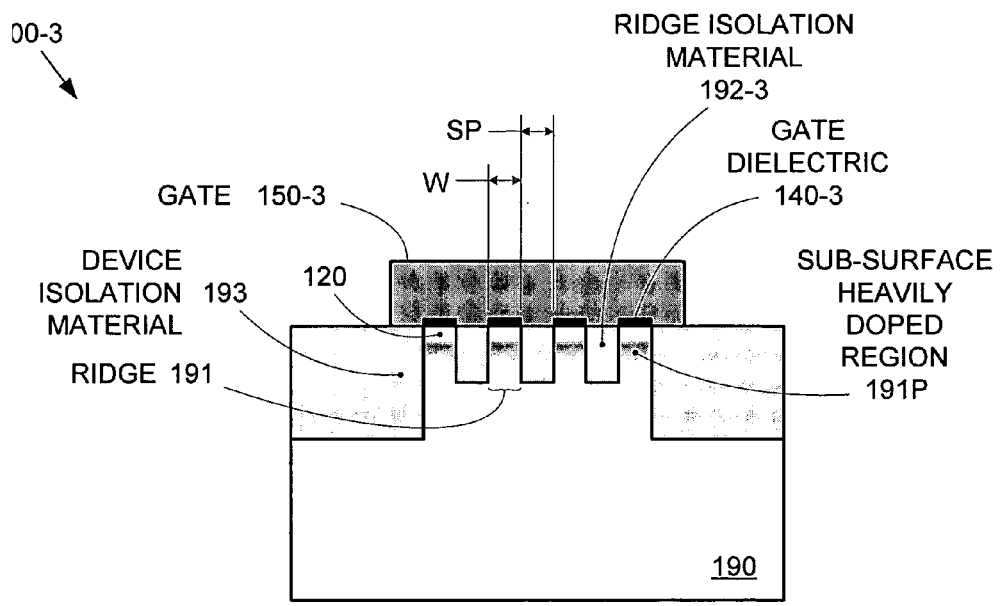

Note further that almost any enhancements available to conventional MOSFET designs can be applied to transistor 100. For example, in one embodiment, the gate of transistor 100 may simply be flush with the top surfaces of ridges 191 (i.e., distance HG shown in FIG. 1B is zero). FIG. 1G shows an alternative cross-sectional view of transistor 100 (labeled as transistor 100-3 for clarity) through view location A—A indicated in FIG. 1A. The cross-sectional view of transistor 100-3 is substantially similar to the cross-sectional view of transistor 100 shown in FIG. 1B, except that in transistor 100-3, ridge isolation material 192-3 extends all the way up the sides of ridges 191, and gate 150-3 (and gate dielectrics 140-3) does not wrap around the top portions of ridges 191. The sub-surface heavy doping provided by the heavily-doped region 191P begins at some depth below the top surface of ridges 191, and can extend to any depth, though it is preferable for the heavily-doped region 191P to not extend past the depth of source 110 and drain 130 in order to minimize junction capacitance and junction leakage current.

Figure 1H:
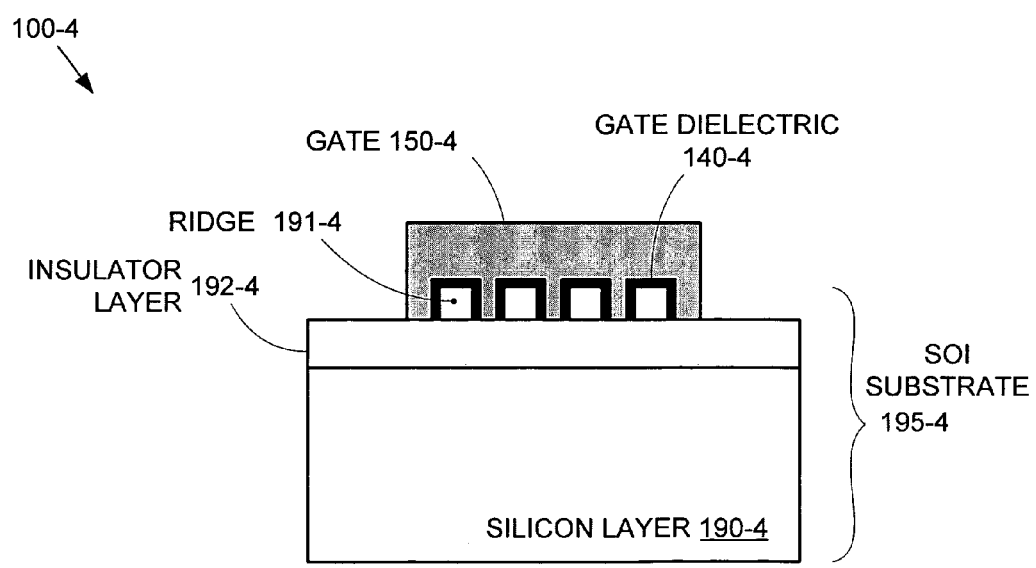

In another embodiment, the segmented channel construction of transistor 100 can be incorporated into a device formed on an SOI substrate. FIG. 1H shows another alternative cross-sectional view of transistor 100 (labeled as transistor 100-4 for clarity) through view location A—A indicated in FIG. 1A. Transistor 100-4 includes ridges 191-4 formed on the insulator layer 192-4 of an SOI substrate 195-4. Gate dielectrics 140-4 are formed over each of ridges 191-4, over which gate 150-4 is formed. Note that transistor 100-4 does not require the ridge isolation material 192 shown in FIG. 1B, because insulator layer 192-4 provides the same electrical isolation. Note further that depending on the height of ridges 191-4, pulse-shaped doping may or may not be necessary to reduce source-to-drain leakage for transistor 100-4, due to the channel-bounding effect of insulator layer 192-4.

Ridges 191 in transistor 100 ideally exhibit a high degree of regularity and consistency to allow optimal functioning of transistor 100. In other words, each of ridges 191 should ideally be dimensionally consistent with every other ridge 191. Furthermore, ridges 191 should be relatively narrow and relatively tightly spaced to allow for maximum flexibility in transistor design and layout efficiency in an IC. For example, it may be desirable to set ridge width $W_R$ and ridge spacing SP each to the minimum gate length (e.g., 35 nm) for transistors in the IC. However, conventional lithographic methods used in semiconductor manufacturing are not able to easily provide such fine-pitched features. Specifically, the optical lithography methods used to define structures in modern semiconductor manufacturing processes use an exposure wavelength of 193 nm, and such methods can only directly produce structures down to ~45 nm in lateral dimension through the use of various optical techniques that attempt to compensate for the lack of actual exposure resolution. For example, techniques such as optical proximity correction (OPC) and phase shift masking (PSM) make use of modified masks that make use of diffraction and interference effects to form pattern features that are smaller than the wavelength of the exposure light.

Figure 2A:
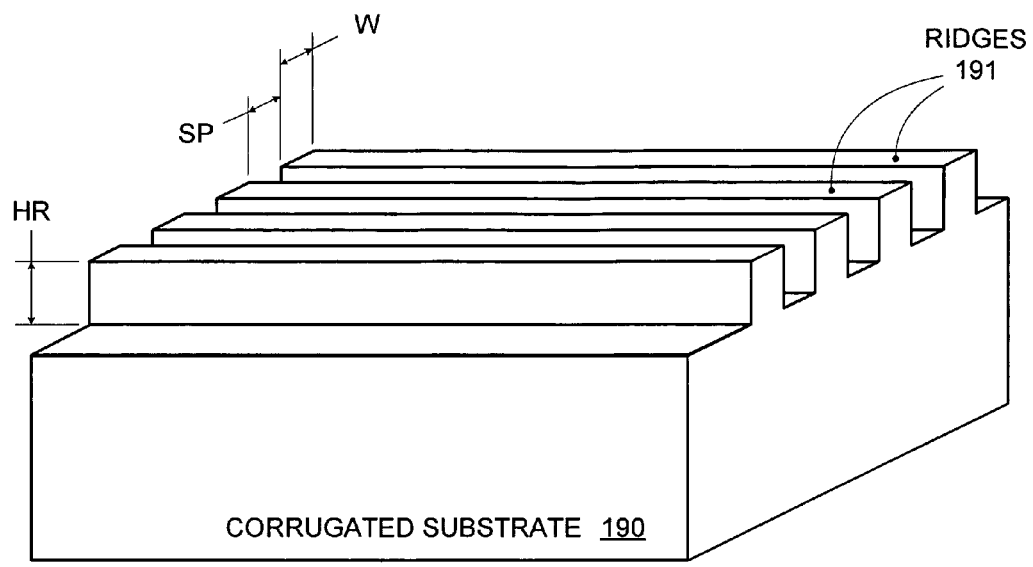
FIGS. 2A, 2B, 2C, 2D, 2E, 2F, 2G, 2H, 2I, 2J, and 2K are steps in a manufacturing process for a transistor having a segmented channel region.

Advantageously, by forming transistor 100 on a set of pre-existing ridges 191, many of the limitations associated with conventional lithographic methods used in semiconductor manufacturing can be overcome. For example, FIG. 2A shows an exemplary corrugated substrate 190 that includes a set of ridges 191. Each of ridges 191 has a height HR, a width W, and a spacing between ridges SP. Because ridges 191 are made prior to any specific device patterning, various processing techniques can be used to generate ridges 191 with a high degree of accuracy and regularity. For example, imprint lithography is a technique in which a master stencil is precisely patterned using electron-beam lithography. The master stencil is then used to pattern wafers (e.g., by imprinting a resist pattern onto a wafer), thereby enabling the formation of precise, sub-wavelength features on those wafers. Due to the complexity of most IC layouts, imprint lithography is generally not practical for use on production wafers. However, the technique is ideal for creating regular, repeating patterns on a wafer, such as ridges 191. The use of imprint lithography can allow ridges 191 to be created with extremely precise and regular dimensions, thereby avoiding the inherent inaccuracies associated with optical lithography. Other techniques for forming ridges 191 (such as spacer lithography described in Y.-K. Choi et al., "A spacer patterning technology for nanoscale CMOS," IEEE Transactions on Electron Devices, Vol. 49, No. 3, pp. 436–441, 2002, in which vertical thin films are created along the sidewalls of sacrificial features, which are subsequently etched away) will be readily apparent.

Note that while ridges 191 are described as being formed from the same material as the underlying bulk substrate (i.e., the non-ridged portion of corrugated substrate 190) for exemplary purposes, according to various other embodiments of the invention, ridges 191 can comprise another semiconductor material or materials. For example, each ridge 191 could include a silicon layer formed over a silicon-germanium alloy layer. Alternatively, each ridge 191 could include a semiconductor layer formed over an insulator layer. Furthermore, according to various other embodiments, ridges 191 can include any type of semiconductor material (e.g., compound semiconductors or carbon nanotubes).

Figure 2B:
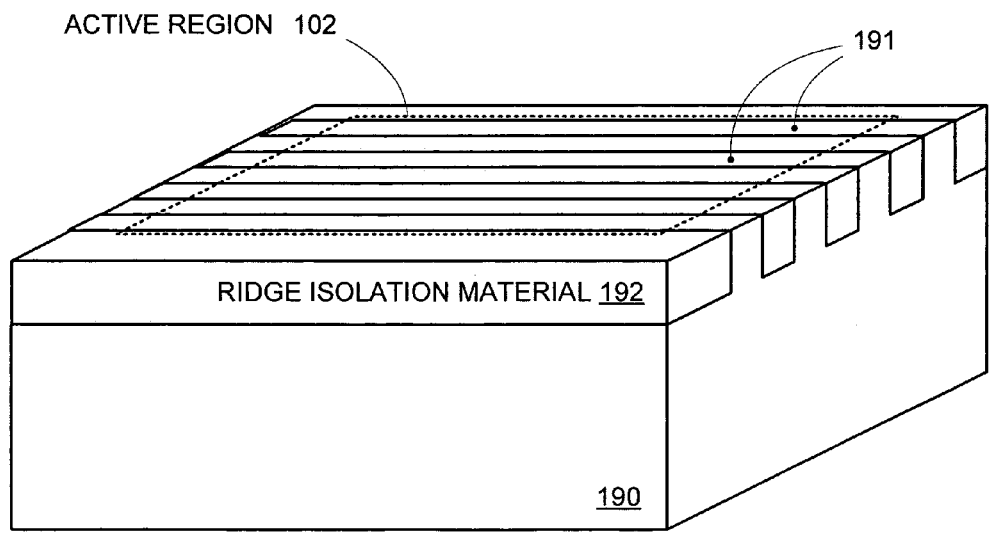

To prepare a corrugated substrate 190 for semiconductor device fabrication, a ridge isolation material 192 is formed around and between semiconductor ridges 191, as shown in FIG. 2B. A planarization operation may be used to ensure that the top surface of ridge isolation material 192 is aligned with the tips of ridges 191. Note that if corrugated substrate is an SOI substrate (e.g., with ridges 191 formed on an insulation layer), or if ridges 191 themselves include an insulating layer, ridge isolation material 192 can be eliminated.

An active region 102 (indicated by the dotted line) is then defined to specify the location for the final transistor(s). Just as in processes used to form conventional ICs, the areas in which the semiconductor devices (i.e., transistors, resistors, and/or capacitors) and/or local interconnects formed in semiconductor material are to be formed can be masked (typically by a lithographic operation). Note that while active region 102 is depicted as spanning four ridges 191 for exemplary purposes, in various other embodiments active region 191 can cover any number of ridges 191, depending on the desired characteristics of the final transistor(s) 100. For example, active region 102 could span a single ridge 191, thereby allowing formation of the final transistor 100 as a FinFET.

Figure 2C:
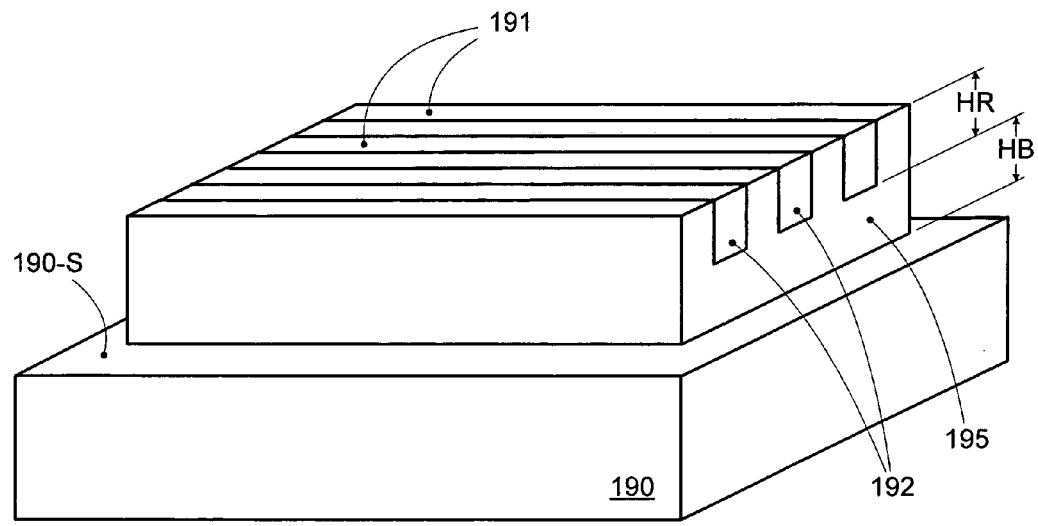

Once active region 102 is defined, ridges 191 and ridge isolation material 192 can be selectively removed in the "field" areas surrounding the active areas (typically by one or more etch operations), as shown in FIG. 2C. This etch operation(s) may reduce the field areas of substrate 190 to a depth greater than the ridge height HR, and it may also partially or completely remove the ridge isolation material 192 in the field regions. Note that elevated base region 195 can be formed by allowing the etch operation(s) to remove material from substrate 190 below the base of ridges 191 in the field regions. Note further that if a single etch is used, the subsequently formed surface 190-S of substrate 190 may exhibit a slightly irregular profile, due to the typically different etch rates of ridge isolation material 192 (e.g., silicon oxide) and ridges 191/substrate 190 (e.g., silicon).

Figure 2D:
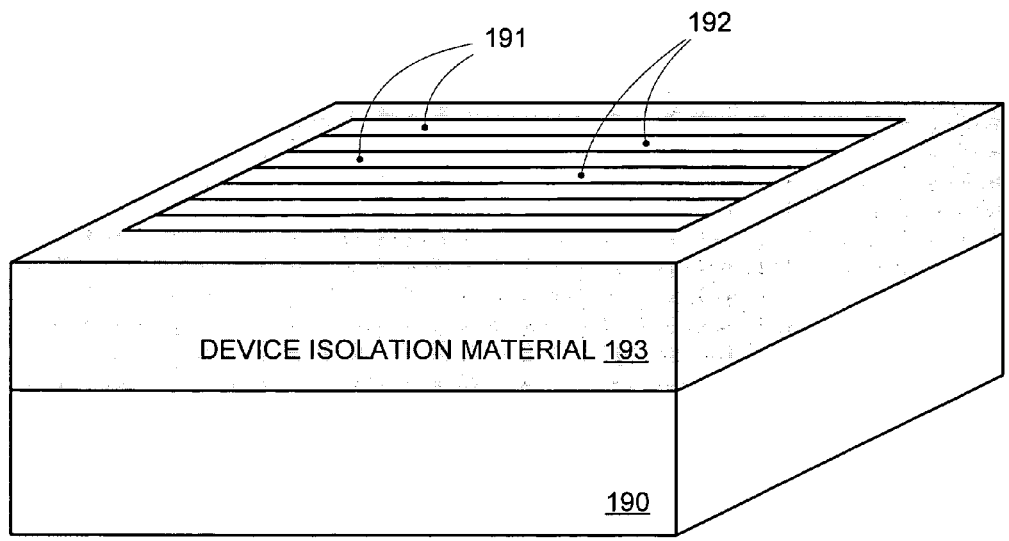

After the active region formation step of FIG. 2C, the field regions are filled with device isolation material 193, as shown in FIG. 2D. Just as described above with respect to the formation of ridge isolation material 192, a planarization operation can be performed to ensure that the top surface of device isolation material 193 is aligned with the top surfaces of ridges 191. Note that the depth of device isolation material 193 is determined by the depth to which the active region definition operation reduces substrate 190 (i.e., distance HB below the base of ridges 191). In one embodiment, device isolation material 193 can be selected to have an etch rate similar to that of ridge isolation material 192, thereby allowing uniform (subsequent) selective etching to expose the tips of ridges 191, as described in greater detail below. Note that if corrugated substrate is an SOI substrate (e.g., with ridges 191 formed on an insulation layer), or if ridges 191 themselves include an insulating layer, device insulation material 193 can be eliminated.

Note further that in one embodiment, ridges 191 may be selectively etched, and the resulting channels defined by the remaining ridge isolation material 192 and device isolation material 193 can be filled with one or more layers of semiconductor material (e.g., silicon, germanium, or silicon-germanium alloy), thereby creating precisely vertically engineered semiconductor ridges. Because the defect density of epitaxially grown semiconductor films is dramatically reduced by spatial confinement, this "etch-refill" approach can provide significant benefit for manufacturing heterostructure semiconductor channel films with low defect density (i.e. high yield). In one embodiment, the layering of semiconductor materials having different lattice constants can provide beneficial stress within ridges 191 to improve final device performance.

Next, in FIG. 2E, ridge isolation material 192 and field insulation material 193 may optionally be selectively etched a distance HG below the top surfaces of ridges 191. The exposed tips of ridges 191 are then covered with gate dielectric layer(s) 140, as shown in FIG. 2F, and a gate 150 is formed over the desired channel region for transistor 100, as shown in FIG. 2G.

Note that in some embodiments, ridge isolation material 192 and device isolation material 193 may be selectively etched in the channel region below the top surfaces of ridges 191 to expose the top or sidewalls of one or more buried layers within the ridges, and the one or more buried layers within the ridges may then be selectively removed in this region so that one or more remaining semiconductor layers within the ridges form bridge(s) in the channel region. Then the exposed surfaces of the semiconductor layers are covered with gate dielectric 140 and gate 150, which as a result wrap around the semiconductor bridges (which also re-forms the portions of ridges 191 removed during the selective etch process), as described in "Silicon-on-Insulator 'Gate-All-Around Device'", by J. P. Colinge et al., *International Electron Devices Meeting Technical Digest*, pp. 595–598, 1990 and also in "A Novel Sub-50 nm Multi-Bridge-Channel MOSFET (MBCFET) with Extremely High Performance," by S.-Y. Lee et al., *Symposium on VLSI Technology Digest of Technical Papers*, pp. 200–201, 2004. Note that if corrugated substrate is an SOI substrate (e.g., with ridges 191 formed on an insulation layer), or if ridges 191 themselves include an insulating layer, then the initial isolation material etch is not necessary.

At this point, an optional light doping operation (e.g., a low-dose ion implantation operation) can be performed on the exposed tips of ridges 191 to form a lightly doped source (i.e., 110-L in FIG. 1C) and a lightly doped drain (i.e., 130-L in FIG. 1C) for transistor 100. Sidewall spacers 161 and 162 may then be formed on either side of gate 150, as shown in FIG. 2H, after which a heavier doping operation may be performed to form the deeper source (110 in FIG. 1C) and drain (130 in FIG. 1C) regions for transistor 100. The exposed portions of gate dielectric layer(s) 140 (i.e., the portions of gate dielectric layer(s) 140 that are not covered by gate 150) may then be removed as shown in FIG. 2I.

Figure 2E:
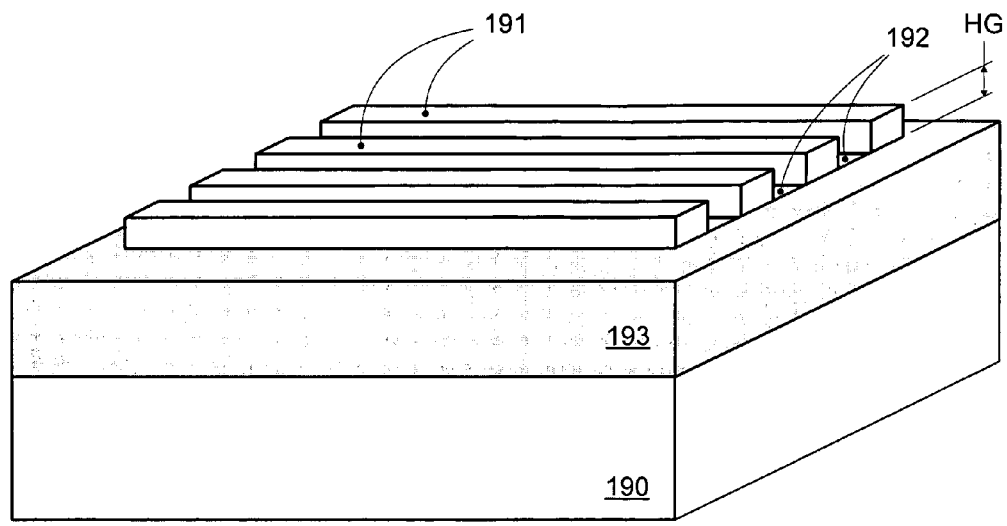
Figure 2F:
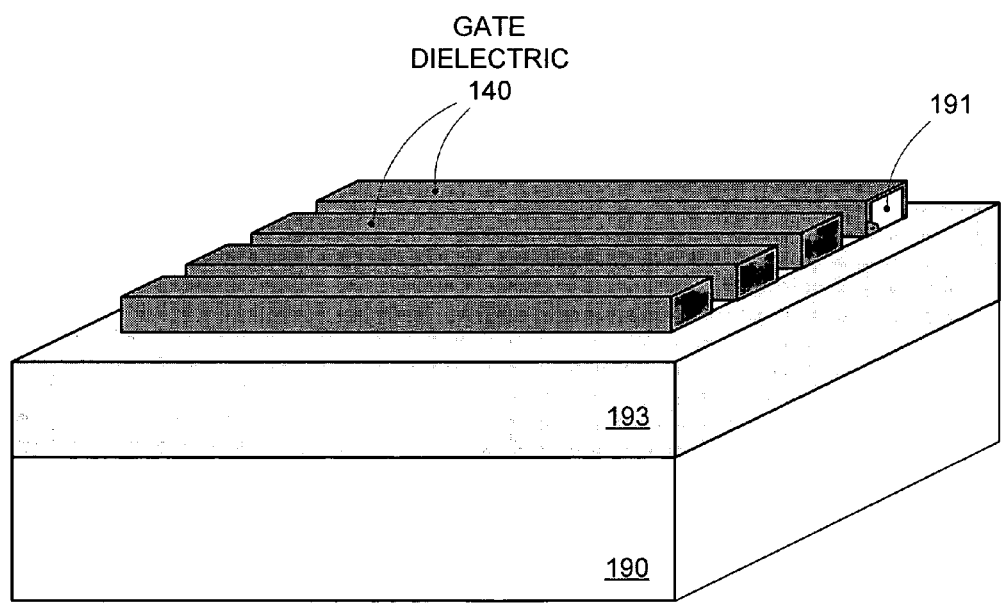
Figure 2G:
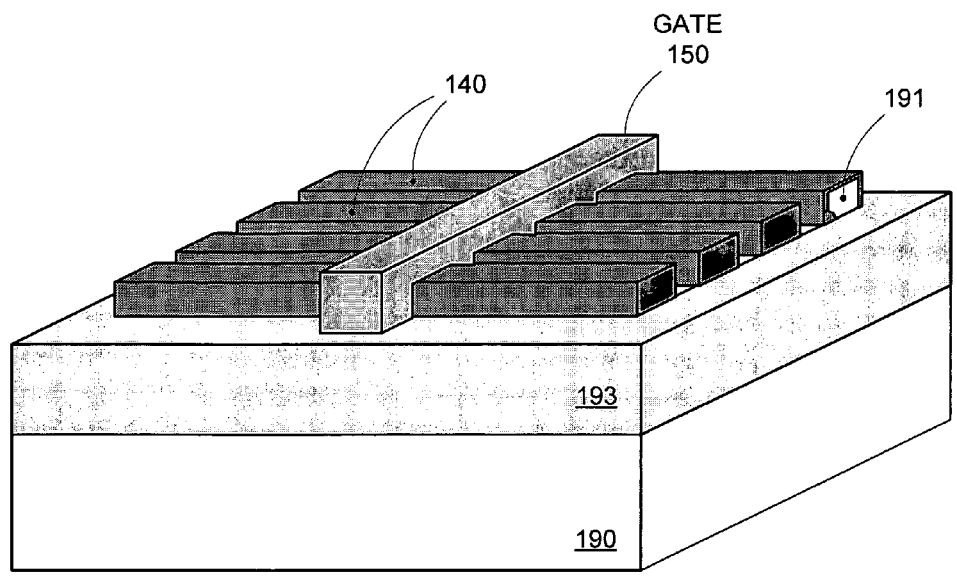
Figure 2H:
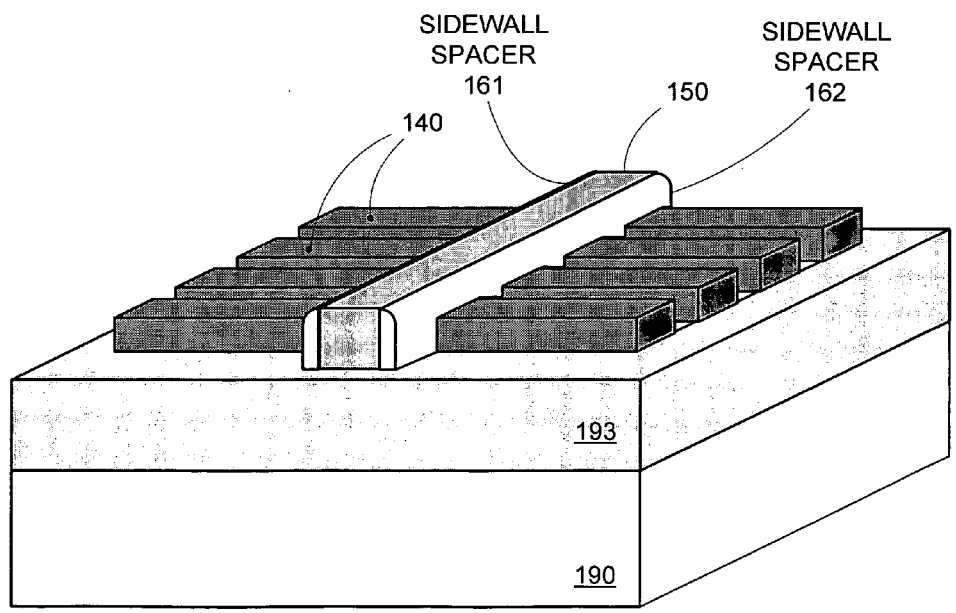
Figure 2I:
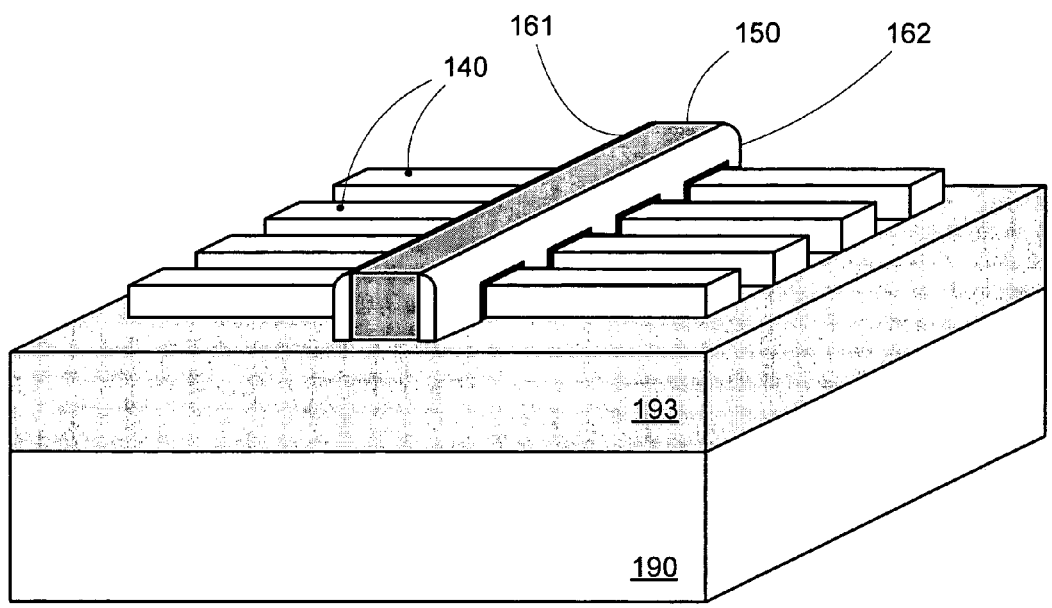
Figure 2J:
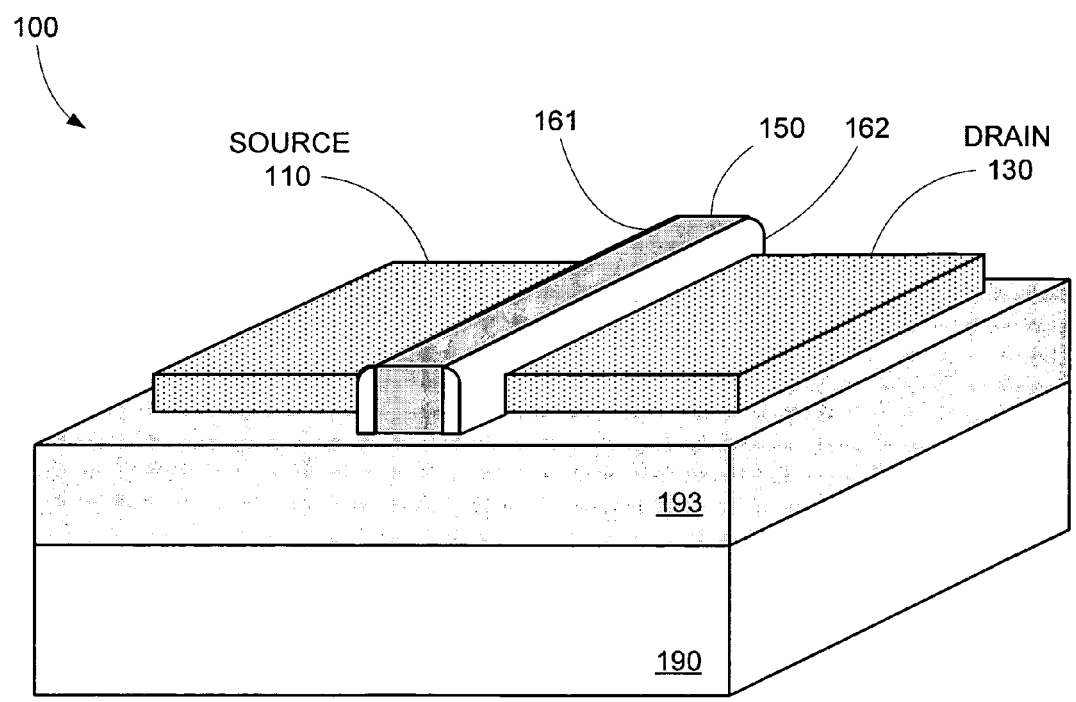

Then, to simplify subsequent source and drain contact formation, the spaces between the exposed portions of ridges 191 can optionally be filled with semiconductor material (which can either be the same material from which ridges 191 are formed or one or more different semiconductor materials), as shown in FIG. 2J. Note that sidewall spacers 161 and 162 can help to isolate gate 150 from the fill material deposited or grown in FIG. 2J. Note that this fill operation may involve filling just the spaces between ridges 191, forming a blanket layer of semiconductor material over ridges 191, "growing" additional material on ridges 191, or any combination of the above. The semiconductor material may be doped in-situ during the deposition/growth process, or it may be doped with a separate doping operation (e.g., a high-dose ion implantation operation). Note that any desired well and/or channel doping (e.g., pulse-shaped doping, halo doping, or pocket doping, among others) process steps could be performed any time up to this point. Note further that as described with respect to FIG. 1C, any source/drain extensions (and/or source/drain regions) may be transformed into a metal-semiconductor compound (e.g., silicide, germanide, or germanosilicide, among others), either before or after the fill operation.

Note further that the physical characteristics of source 110 and drain 130 can vary depending on the process used to create the fill material around ridges 191. For example, the fill material (as described with respect to the formation of source 110 and drain 130 in FIG. 2J) may be formed using epitaxial growth, thereby causing source 110 and drain 130 to exhibit a very homogeneous structure. Alternatively, conformal deposition may be used such that source 110 and drain 130 exhibit a "striped" structure, with ridges 191 alternating with the new fill material. In such a circumstance, source 110 and drain 130 can include discrete structures that are continuous with ridges 191 in the channel region.

Note also that in one embodiment, the exposed portions of ridges 191 can be etched prior to epitaxial growth of the filler material. By then growing an appropriate semiconductor material over the reduced-height (or completely eliminated, if the etch removes material down to elevated base region 195 shown in FIGS. 1B–1D or below) portions of ridges 191, a desired stress can be induced in the portions of ridges 191 beneath gate 150 (i.e., in the channel region of transistor 100).

For example, by etching the exposed portions of ridges 191 and then growing silicon-germanium alloy ($Si_{1-x}Ge_x$) in the source/drain contact regions, compressive uniaxial stress can be induced in the channel region to enhance the mobility of holes, thereby providing enhanced p-channel MOSFET performance. On the other hand, growing silicon-carbon alloy ($Si_xC_{1-x}$), rather than silicon-germanium, would induce tensile uniaxial stress in the channel region to enhance the mobility of electrons, thereby providing enhanced n-channel MOSFET performance. As noted above, the confinement of epitaxial growth to small-dimensioned regions (such as source 110 and drain 130 in FIG. 2J) helps to reduce the defect density in the epitaxially grown material, which allows maximum stress levels to be achieved. This in turn enables the generation of consistent stress levels from transistor to transistor, thereby enhancing the uniformity of transistor performance across an IC.

Note that in another embodiment, a portion of the ridges underneath the gate may be selectively removed and optionally refilled (e.g. with an insulating material), prior to epitaxial growth of the filler material, in a manner similar to that described in "Silicon-on-Nothing (SON)—an Innovative Process for Advanced CMOS", by M. Jurczak et al., *IEEE Transactions on Electron Devices*, Vol. 47, No. 11, pp. 2179–2187, November 2000. Note that in another embodiment, the etched portions of ridges 191 (on either side of gate 150) can each be covered with a blanket layer of semiconductor material (different than the ridge material) to define the regions for source 110 and drain 130.

Figure 2K:
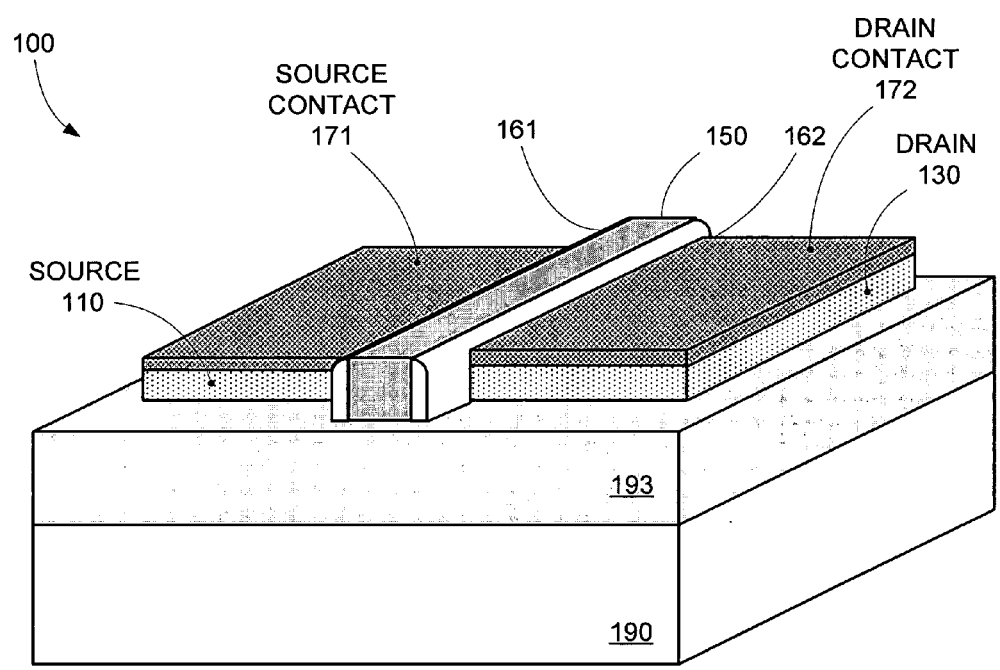

In any case, to complete transistor 100, source contact region 171 and drain contact region 172 are formed over source 110 and drain 130, respectively, and directly abutting sidewall spacers 161 and 162, respectively, as shown in FIG. 2K. Note that while contacts can be made to the exposed ridges 191 (in which case the source contact region 171 and drain contact region 172 would simply consist of the exposed portions of ridges 191) shown in FIG. 2I without undue difficulty, device manufacturers generally prefer to form contacts on planar surfaces, such as depicted for source 110 and drain 130 in FIGS. 2J and 2K. In various embodiments, source contact region 171 and drain contact region 172 may each be comprised in part of a metal-semiconductor compound such as silicide, germanide, or germanosilicide to provide lower contact resistance. Note that according to various embodiments, additional stress engineering structures (e.g., a stressed capping layer over gate 150, source 110, and drain 130) can be subsequently formed on transistor 100 (as described with respect to FIG. 1B).

Figure 3A:
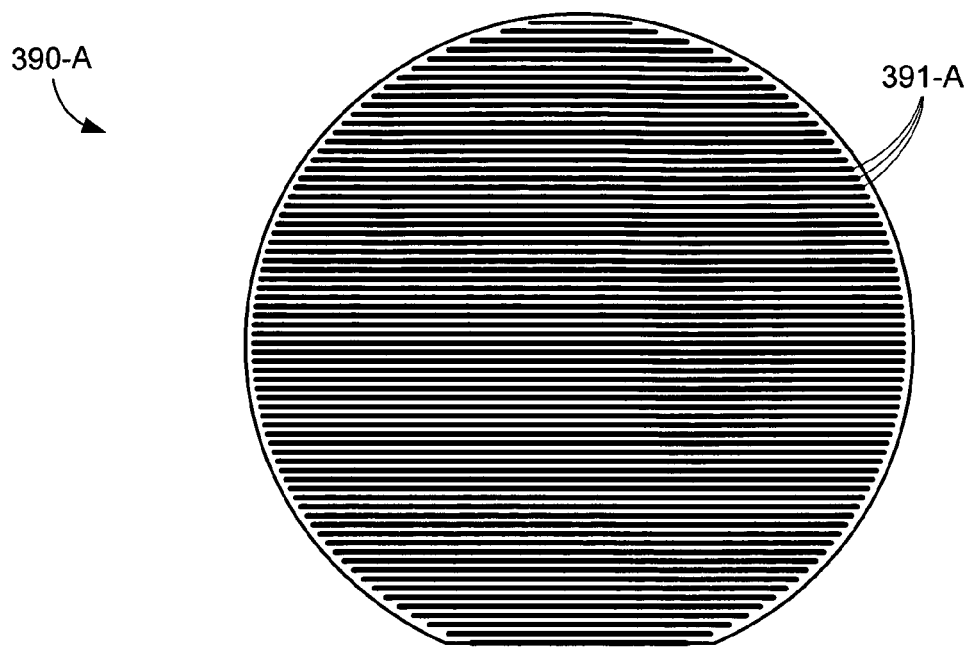
FIGS. 3A, 3B, 3C, and 3D are top views of different corrugated substrates that can be used in the manufacture of ICs that incorporate transistors having segmented channel regions.

As described above with respect to FIG. 2A, by creating ridges 191 as standalone structures prior to discrete device definition, ridges 191 can be formed with a high degree of precision (±15% tolerances and better) using techniques that would not necessarily be suitable for general IC production (e.g., imprint lithography and spacer lithography). In one embodiment, a semiconductor wafer can be fully patterned with such ridges, thereby allowing subsequent formation of transistor(s) 100 at any desired location on the wafer. For example, FIG. 3A shows a top view of a wafer 390-A that includes an array of ridges 391-A running across almost the entire wafer surface. Ridges 391-A are substantially similar to ridges 191 described previously, and have a predetermined height (HR in FIG. 2A), width (W in FIG. 2A), spacing (SP in FIG. 2A), and composition (e.g., silicon, silicon-germanium, silicon on silicon-germanium, or carbon nanotubes, among others). By forming ridges at the wafer level, IC production costs are minimally impacted, since this type of simple bulk patterning is much less complex (and therefore much less expensive) than the localized feature formation performed during subsequent IC processing. Note that in one embodiment, wafer 391-A can include ridge isolation material (e.g., ridge isolation material 192 shown in FIG. 2B) between ridges 391-A.

Figure 3B:
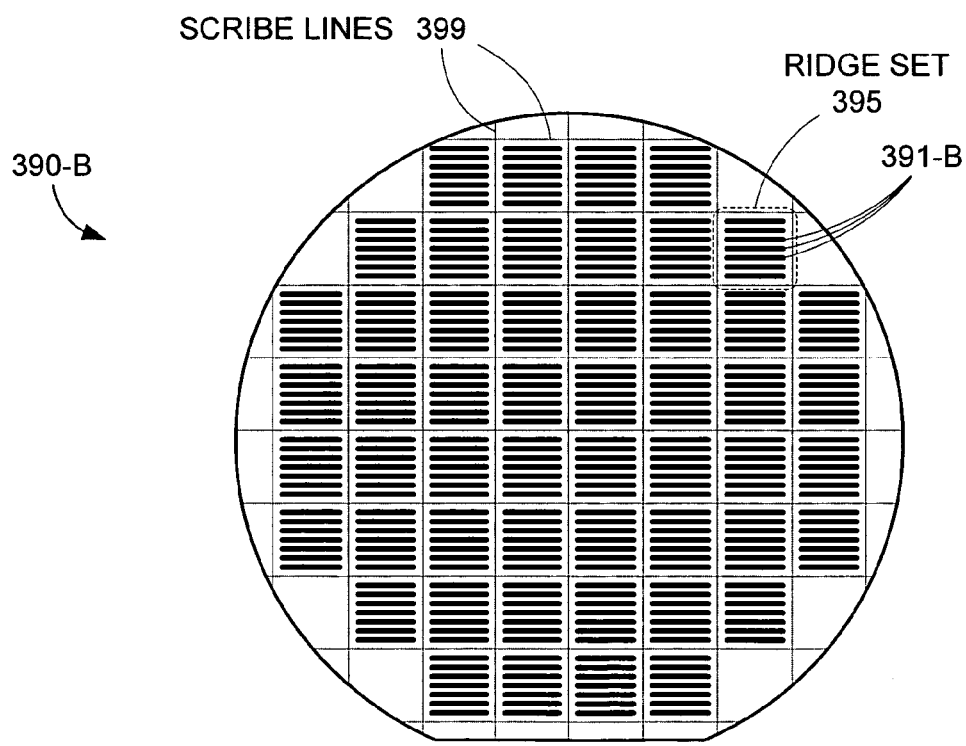

Note further that in various other embodiments, a corrugated substrate can include localized groupings of parallel ridges, rather than the continuous ridges 391-A that span the entire wafer surface as shown in FIG. 3A. For example, FIG. 3B shows another embodiment of a corrugated substrate 390-B that includes localized ridge sets 395. Each localized ridge set includes ridges 391-B that exhibit the same dimensional and physical consistency as described with respect to ridges 391-A shown in FIG. 3A, but are discontinuous across scribe lines 399, which can simplify subsequent IC formation and wafer dicing operations. Therefore, each die location on corrugated substrate 390-B (i.e., each location where an IC is to be formed) includes a separate ridge set 395. As described with respect to FIG. 3A, ridge sets 395 can also include ridge isolation material between ridges 391-B. Note that in some embodiments, within each ridge set 395, localized groupings of ridges 391-B may exhibit different material compositions (as described in greater detail below with respect to FIG. 4A).

Figure 3C:
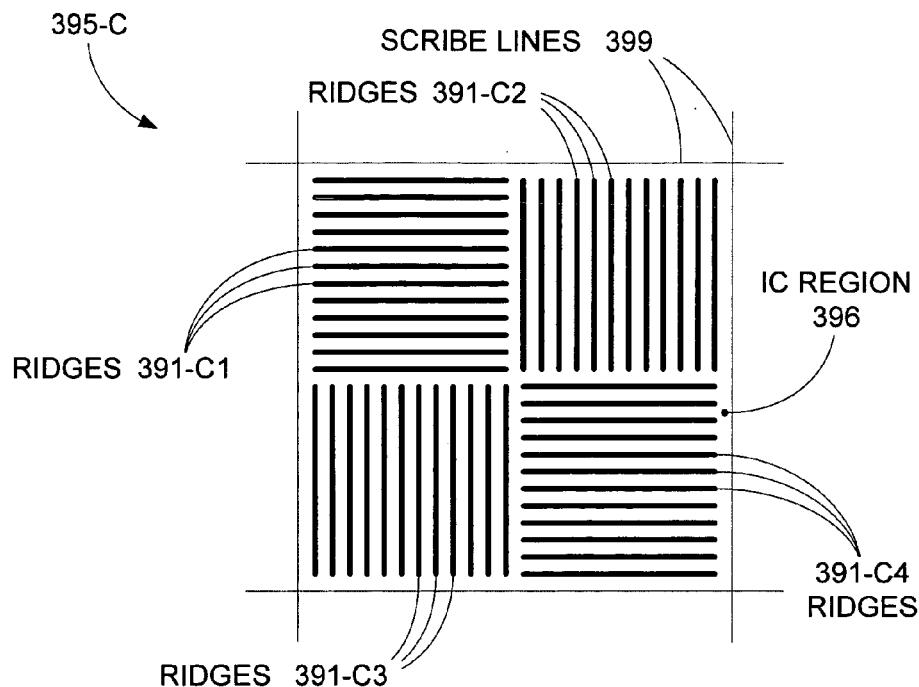

Note further that while ridges 391-B are all shown running in the same direction for exemplary purposes, according to various other embodiments, a corrugated substrate can include multiple localized ridge sets, wherein the ridges in different sets run in different directions. For example, FIG. 3C shows a top view of an alternative localized ridge set 395-C that could be implemented in place of localized ridge sets 395 in FIG. 3B. Localized ridge set 395-C includes a ridge set including parallel ridges 391-C1, a ridge set including parallel ridges 391-C2, a ridge set including parallel ridges 391-C3, and a ridge set including parallel ridges 391-C4. As described with respect to FIG. 3B, optional ridge isolation material can separate the ridges in each of the ridge sets. Parallel ridges 391-C1 and 391-C4 run perpendicular to parallel ridges 391-C2 and 391-C3. Any other arrangement of ridges can provide the benefits described above, so long as the ridges in any particular set of parallel ridges are longer than the critical dimension (i.e., the minimum geometry) of the devices being formed using the ridges. Note, however, that the ridges themselves may actually be thinner than the critical dimension (since the ridges can be manufactured using techniques other than those ordinarily used in actual device production, as described above). Note further that while the areas occupied by parallel ridges 391-C1, 391-C2, 391-C3, and 391-C4 are depicted as being roughly equal for exemplary purposes, the different ridge groupings within a die location (i.e., between scribe lines) can exhibit any desired sizing relationship with one another.

Figure 3D:
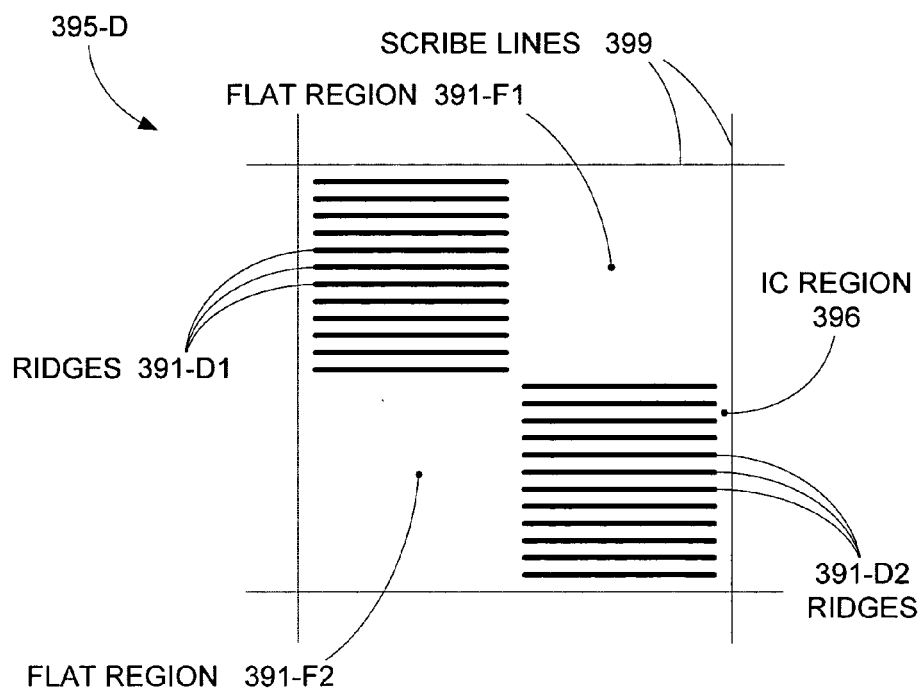

Note further that a corrugated substrate can include large planar semiconductor surface regions. For example, FIG. 3D shows a top view of an alternative localized ridge set 395-D that could be implemented in place of localized ridge sets 395 in FIG. 3B. Localized ridge set 395-D includes a ridge set including parallel ridges 391-D1 (separated by optional ridge isolation material), a ridge set including parallel ridges 391-D2 (separated by optional ridge isolation material), and planar (unridged) semiconductor surface regions 391-F1 and 391-F2. Conventional planar semiconductor devices (i.e., transistors, resistors, and/or capacitors) can be formed in these planar semiconductor surface regions 391-F1 and 391-F2 simultaneously with corrugated-semiconductor devices, e.g. by using the fabrication process flow described above. Note that while planar semiconductor surface regions 391-F1 and 391-F2 are depicted as covering roughly the same area as parallel ridges 391-D1 and 391-D2 for exemplary purposes, groupings of parallel ridges and planar regions can exhibit any relative sizing. Note further that a portion of a corrugated substrate can be considered a planar region so long as that portion provides an unridged area that is at least as wide as two ridges plus the spacing between those two ridges.

Ideally, a corrugated substrate will include sets of parallel ridges that cover an area at least as large as a basic functional block (e.g., a set of devices that performs a particular logic function). A corrugated substrate providing ridge sets sized in this manner can beneficially minimize the need for additional interconnect wiring between devices within functional blocks. Larger ridge sets can likewise minimize interconnect wiring requirements between functional blocks.

Figure 4A:
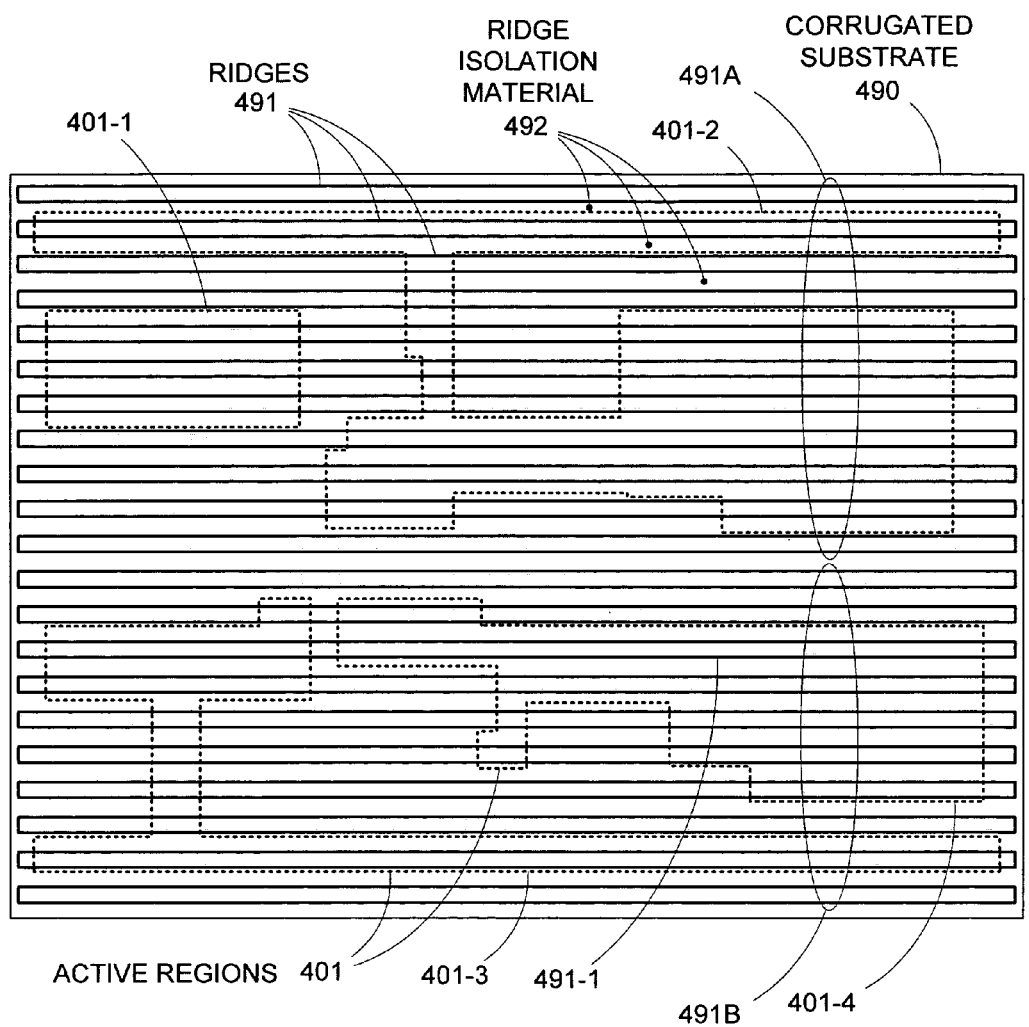
FIGS. 4A, 4B, 4C, 4D, and 4E are steps in a manufacturing process for an IC that incorporates transistors having segmented channel regions.

For example, FIG. 4A shows a corrugated substrate 490 that includes a set of parallel ridges 491, optionally supplied with ridge isolation material 492 present between ridges 491 (alternatively, a dielectric formation operation can be performed to form ridge isolation material 492, in a manner substantially similar to that described with respect to FIG.

2B). Ridges 491 are substantially similar to ridges 191 described previously, and have a predetermined height (HR in FIG. 2A), width (WR in FIG. 2A), spacing (SP in FIG. 2A), and composition (e.g., silicon, silicon germanium, silicon on silicon-germanium, or carbon nanotubes, among others). Active regions 401 (indicated by the dotted lines) represent locations where functional elements of a circuit are to be formed.

Note that while ridges 491 are dimensionally very similar, the composition of ridges 491 can vary. For example, a ridge group 491A could include a top silicon layer (e.g. a silicon ridge) providing (110) surface crystalline orientation, and a ridge group 491B could include a top silicon layer (e.g., an SOI ridge) providing (001) surface crystalline orientation. Then, if active regions 401-1 and 401-2 represent regions in which PMOS devices are to be formed, the ridges 491 in ridge group 491A provide a surface crystalline orientation optimized for PMOS performance. Similarly, if active regions 401-3 and 401-4 represent regions in which NMOS devices are to be formed, the ridges 491 in ridge group 491B provide a surface crystalline orientation optimized for NMOS performance.

Figure 4B:
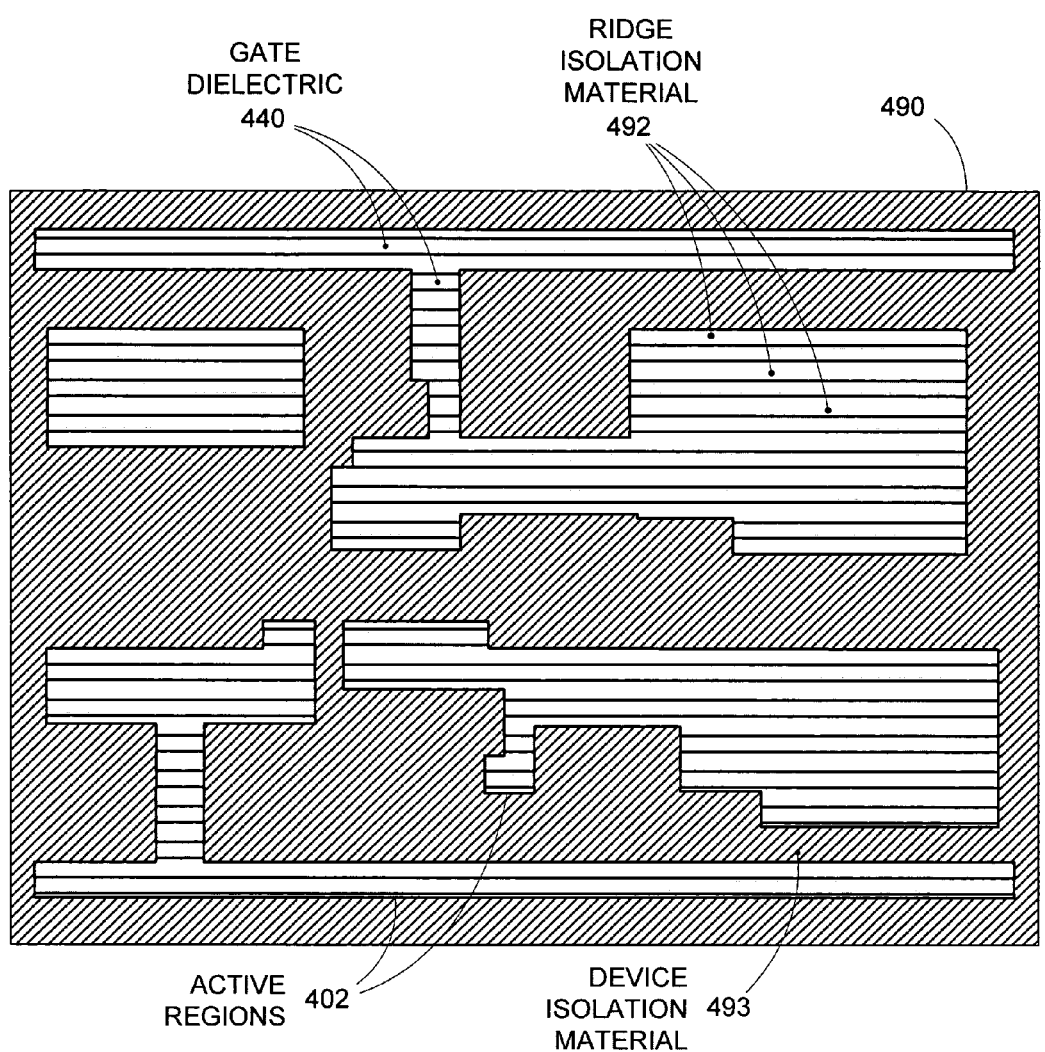

To begin the manufacturing process, the portions of ridges 491 (and all or part of ridge isolation material 492) that lie outside of the active regions 401 are removed (e.g., the portions of ridges 491 and insulation material 492 within active regions 401 could be masked, and the unmasked portions of ridges 491 and ridge isolation material 492 could then be etched away, as described with respect to FIG. 2C). Non-ridge portions of substrate 490 are then filled with device insulation material 493 (e.g., shallow trench isolation), as shown in FIG. 4B (e.g., as described with respect to FIG. 2D), and ridge isolation material 492 and device isolation material 493 can optionally be etched to expose the top portions of the remaining ridges 491 (e.g., as described with respect to FIG. 2E). The exposed portions of ridges 491 are then covered with gate dielectric layer(s) 440 (as described with respect to FIG. 2F).

Figure 4C:
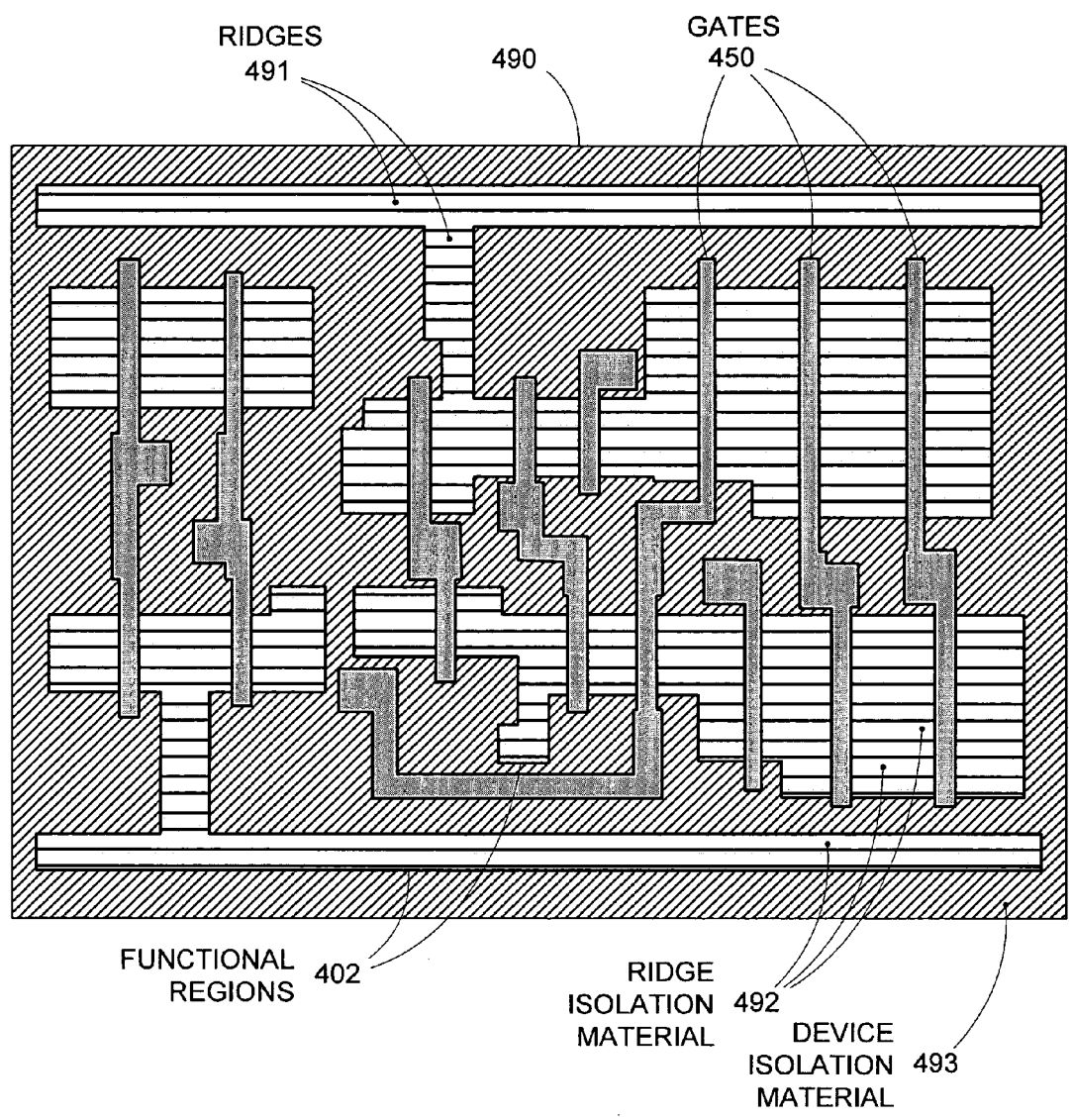
Figure 4D:
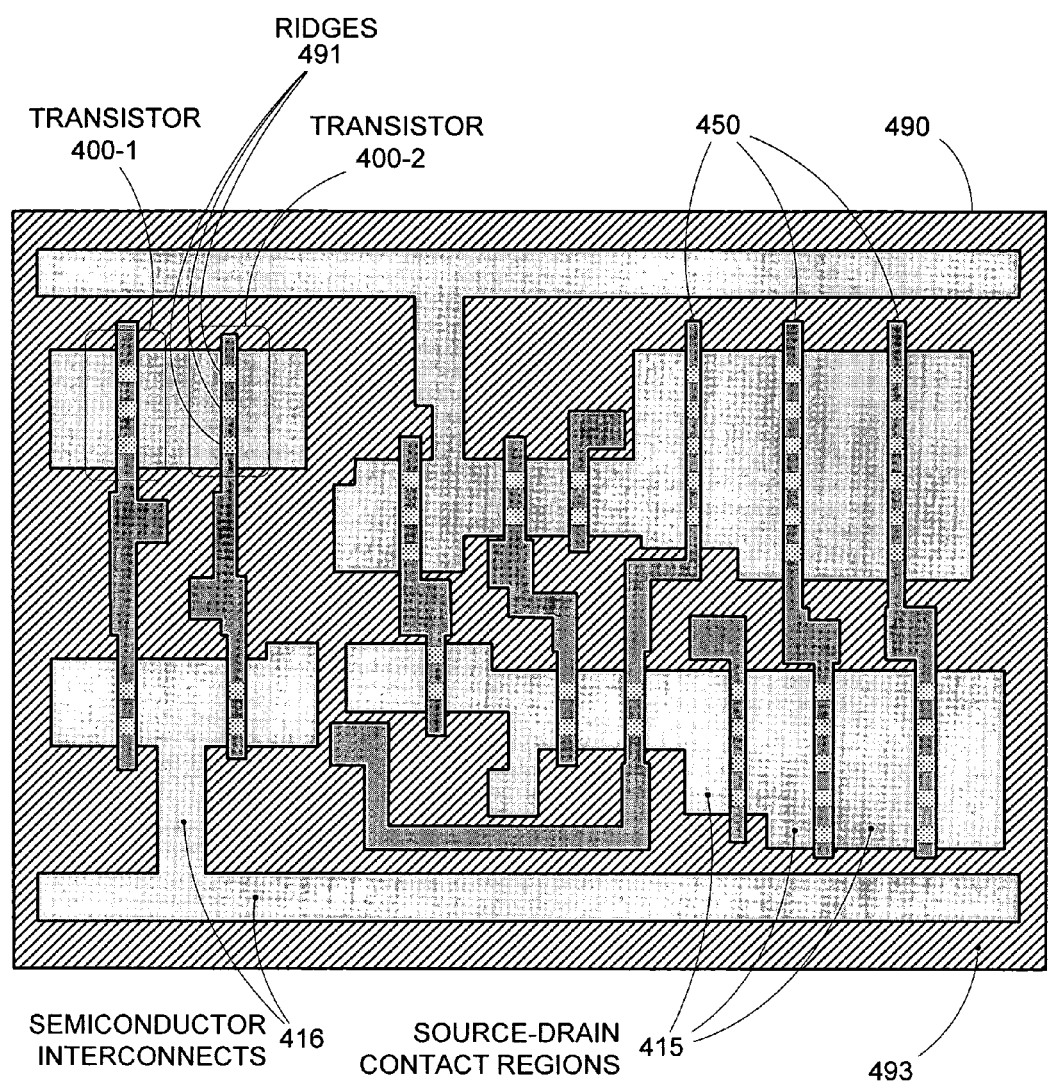
Figure 4E:
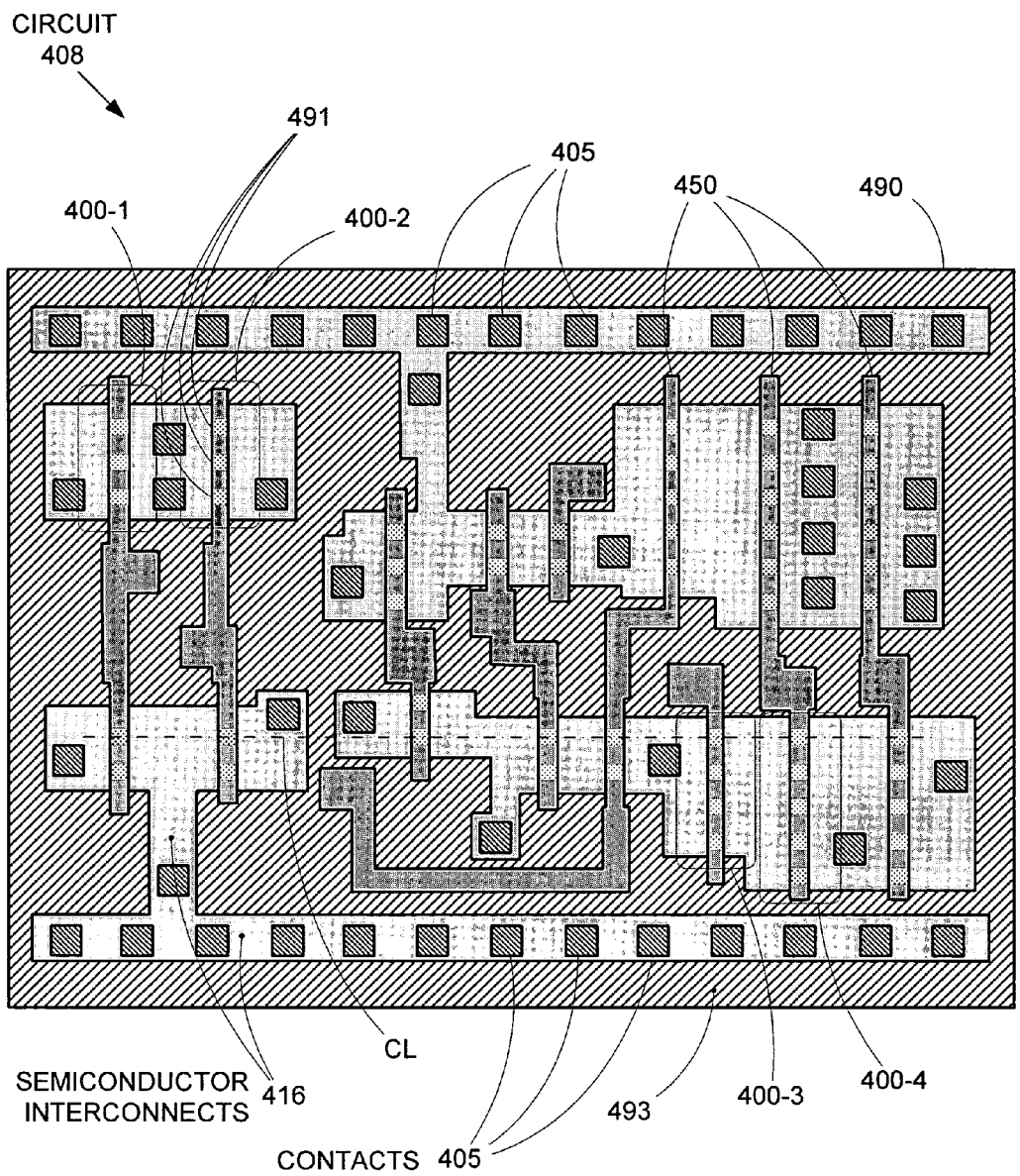

Next, in FIG. 4C, gates 450 are formed over desired transistor channel locations, as described with respect to FIG. 2G. At this point, an optional doping operation (e.g., ion implantation operation) can be performed to create source/drain extensions (e.g., 110-L and 130-L in FIG. 1C) within the ridges in the regions not covered by gates 450. Sidewall spacers (not shown for clarity) may then be formed along the sidewalls of gates 450 (e.g., as described with respect to FIG. 2H), after which a heavier doping operation can be performed to form deeper source and drain regions (e.g., 110 and 130 in FIG. 1C). The portions of gate dielectric layers 440 that are not covered by gates 450 may then be removed (e.g., etched selectively off of ridges 491, as described with respect to FIG. 2I)). The exposed portions of ridges 491 can be filled-in with semiconductor material to form large source-drain contact regions 415 and semiconductor interconnects 416, as shown in FIG. 4D (e.g., as described with respect to FIG. 2J). The source-drain contact regions 415 can be doped in-situ during the deposition/ growth of the semiconductor material, or they may be doped with a separate doping operation (e.g., a high-dose ion implantation operation), to complete the transistors in the circuit (e.g., transistors 400-1 and 400-2). In addition, any desired well and/or channel doping (e.g., pulse-shaped doping) could be performed on ridges 491 (at any time up to this point). Furthermore, any desired metal-semiconductor compound formation in source/drain extension regions (and/or source/drain regions) can be performed. For reference purposes, the portions of ridges 491 in the channel regions of the transistors are indicated by the lightly shaded rectangles in gates 450 in FIG. 4D. A metal-semiconductor compound (e.g., silicide, germanide, or germanosilicide) may be formed in source-drain contact regions 415 (as described with respect to FIG. 2K) to reduce contact resistance. Note that if the gate "overhang" distance HG (e.g., as shown in FIGS. 1B and 2E) for a given transistor(s) in FIG. 4D is greater than the ridge width W (e.g., as shown in FIGS. 1B and 2A) of that transistor, then that transistor would essentially be a FinFET. In any case, to complete the IC, standard passivation, contact formation, metallization, and post-metallization annealing (PMA) can then be performed to complete circuit 408 depicted in FIG. 4E (metallization not shown for clarity).

As noted above, the source-drain contact regions 415 consisting of "filled" ridges 491 provide reliable landing locations for contacts 405 (although contacts could also be made to the original ridges 491 themselves). Furthermore, the semiconductor interconnects 416 formed in this manner provide device-level electrical connections. Consequently, the metallization requirements for circuit 408 are reduced, which can reduce cost and provide greater interconnect routing flexibility in the metal layer(s) of circuit 408. Note that in one embodiment, transistors formed along common ridges 191 (e.g., transistors 400-1 and 400-2), could include unfilled ridges 191 to provide an electrical connection between the transistors.

Note further that due to the use of a corrugated substrate (490) in the formation of circuit 408, the channel segments (ridges 491) in adjacent transistors will always be closely aligned. For example, each of the eight transistors running across the bottom of circuit 408 (formed at gates 450) includes a channel segment aligned along a centerline CL. Such an arrangement is inevitable, since each of those channel segments was originally part of a single ridge 491 (i.e., ridge 491-1 shown in FIG. 4A). Each channel segment along centerline CL can easily exhibit dimensional consistency and alignment accuracy within 5% from segment to segment (i.e., the widths and centerlines of the channel segments will all be within 5% of the widths and centerlines, respectively, of all the other channel segments). In contrast, a circuit manufactured using a conventional (non-corrugated) substrate will not exhibit the same degree of dimensional consistency and channel alignment, due to the lack of similar alignment constraints in the design and manufacturing process, and more importantly, due to inherently irregular patterns defined by optical lithography in IC manufacturing processes.

Figure 5:
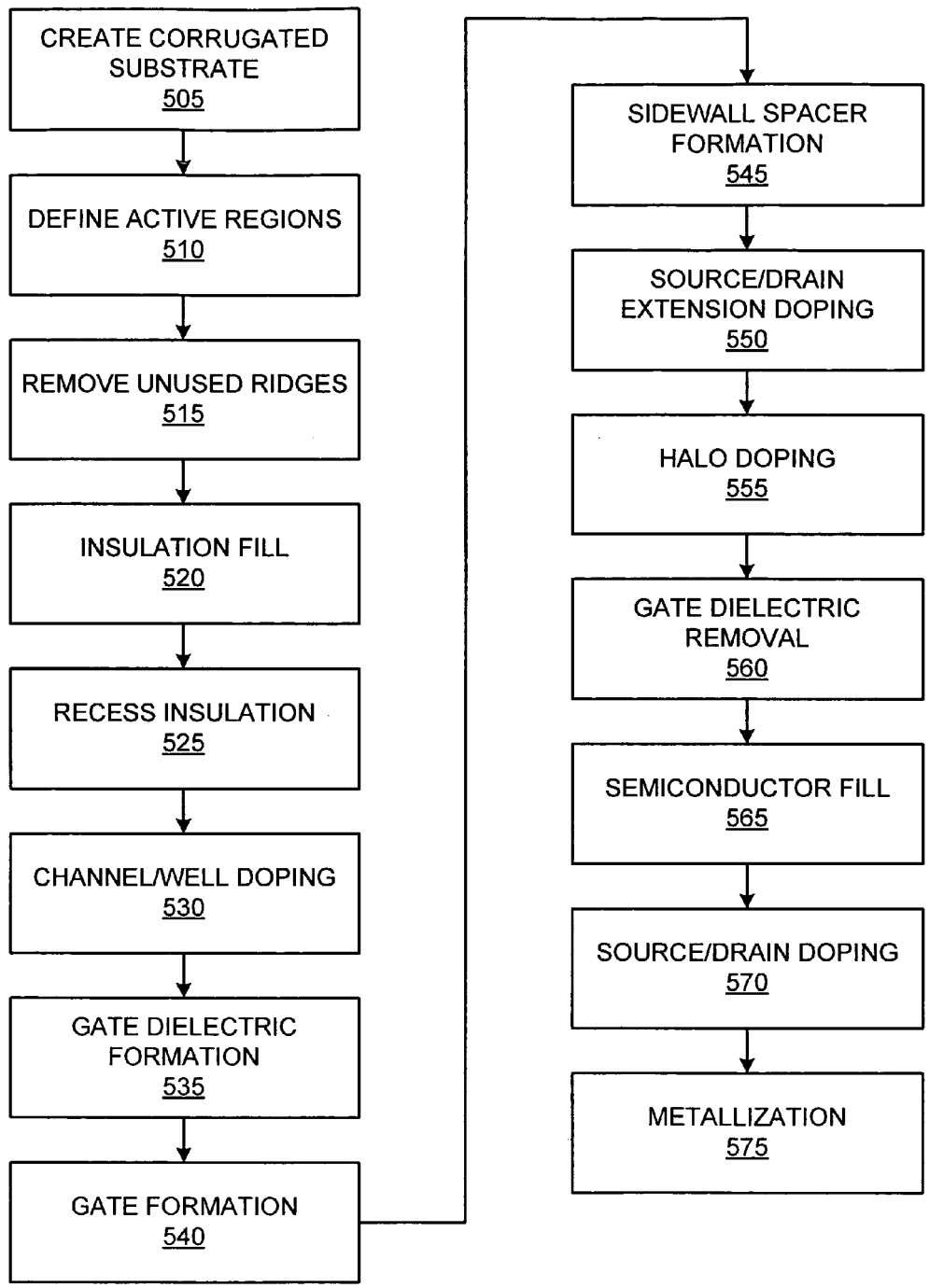
FIG. 5 is a flow diagram of a process for manufacturing an IC that incorporates transistors having segmented channel regions.

FIG. 5 shows a flow diagram of the manufacturing process described with respect to FIGS. 2A–2I and 4A–4E. First, in an optional "CREATE CORRUGATED SUBSTRATE" step 505, a corrugated substrate (e.g., 190 in FIG. 2A, 390-A in FIG. 3A, 390-B in FIG. 3B, and 490 in FIG. 4A) is formed using a high-precision manufacturing technique (e.g., imprint lithography or spacer lithography). Alternatively, a pre-made corrugated substrate can be used. Step 505 can also include a ridge isolation material formation operation (e.g., if isolation material is not included in the pre-made corrugated substrate).

Then, the active regions for the circuit (i.e., regions in which devices and optionally semiconductor interconnects are to be formed) are defined in a "DEFINE ACTIVE REGIONS" step 510 (as described with respect to FIGS. 2B and 4A). The ridges (and all or part of the ridge isolation material) outside of the active regions are then removed (e.g., etched away) in a "REMOVE UNUSED RIDGES" step 515 (as described with respect to FIGS. 2C and 4B), and device isolation material (e.g., device isolation material 493 in FIG. 4B) can be formed in the cleared field regions of the wafer in an optional "INSULATION FILL" step 520 (as described with respect to FIG. 2D). In one embodiment, the insulation layer can be formed over the ridges, and can subsequently be planarized down to the surface level of the ridges.

Top portions of the ridge isolation material and the device isolation material can then be removed in an optional "RECESS INSULATION" step 525 to expose top portions of the ridges (as described with respect to FIGS. 2E and 4B). Optional well/channel doping (e.g., pulse-shaped doping) can be performed at this point in a "CHANNEL/WELL DOPING" step 530, or at any point before "METALLIZATION" step 575. The exposed portions of the ridges can then be coated with a gate dielectric layer in a "GATE DIELECTRIC FORMATION" step 535 (as described with respect to FIGS. 2F and 4B), and gates can be formed over the desired portions of the coated ridges in a "GATE FORMATION" step 540 (as described with respect to FIGS. 2G and 4C). If desired, source/drain extensions can be formed at this point in an optional "SOURCE/DRAIN EXTENSION DOPING" step 545 (as described with respect to FIGS. 2G and 4C). Sidewall spacers can be formed along the sidewalls of the gates in an optional "SIDEWALL SPACER FORMATION" step 550 (as described with respect to FIGS. 2H and 4C). Optional halo or pocket doping can be performed at this point in an optional "HALO DOPING" step 555 (e.g., as described with respect to FIGS. 1E and 1F). The unused portions of the gate dielectric layers (i.e., the portions not separating the gates from the ridges) can then be removed in an optional "GATE DIELECTRIC REMOVAL" step 560 (as described with respect to FIGS. 2I and 4C).

The spaces between the ridges can then be filled with semiconductor material in an optional "SEMICONDUCTOR FILL" step 565 and the source and drain regions for each of the transistors (i.e., the regions not covered by a gate) can then be doped in a "SOURCE/DRAIN DOPING" step 570 (as described with respect to FIGS. 2J and 4D). Note that in other embodiments, the source/drain doping performed in step 570 can be performed before the semiconductor fill operation of step 565. Note further that, as described with respect to FIGS. 2I and 2J, step 565 can involve etching down the ridges next to some or all of the gates and forming a different semiconductor material over the etched regions (either on individual ridges or as a blanket layer over all ridges) to induce a desired stress within the channel regions of the devices. Note further that in various embodiments, metal-semiconductor compound formation in source/drain extension regions (and/or source/drain regions) can be performed during step 570 (which can, in certain circumstances, eliminate the need for doping in the source/drain regions). Finally, any remaining operations for completing the circuit are performed in a "METALLIZATION" step 575 (e.g., source-drain contact region metal-semiconductor compound formation (e.g., silicidation, germanidation, or germanosilicidation), device passivation (including any additional stress engineering, such as forming stressed capping layers), contact formation, metallization, and PMA, as described with respect to FIGS. 2K and 4E).

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. An integrated circuit (IC) comprising a first plurality of transistors, wherein each of the first plurality of transistors comprises:

a source;

a drain;

a channel region between the source and the drain; and a gate over the channel region, wherein the channel region comprises a set of semiconductor segments connecting the source and the drain, and wherein a centerline of a first one of the set of semiconductor segments in each of the plurality of transistors is aligned with a first common centerline, wherein each of the first plurality of transistors further comprises:

a set of gate dielectrics, each of the set of gate dielectrics covering a top surface of one of the set of semiconductor segments; and a gate over the set of semiconductor segments, wherein the gate is separated from the set of semiconductor segments by the set of gate dielectrics, wherein each of the set of gate dielectrics in each of the first plurality of transistors extends down both sides of one of the set of semiconductor segments in the each of the first plurality of transistors by a first distance, and wherein the gate in each of the first plurality of transistors extends down both sides of each of the set of semiconductor segments in the each of the first plurality of transistors by the first distance, wherein the each of the set of semiconductor segments in the each of the first plurality of transistors includes a sub-surface heavily doped region, wherein the sub-surface heavily doped region in the each of the set of semiconductor segments in the each of the first plurality of transistors reaches at least 50% of maximum dopant concentration at the first distance below the top surface of the each of the set of semiconductor segments.

2. The IC of claim 1, wherein the sub-surface heavily doped region in the each of the set of semiconductor segments in the each of the first plurality of transistors reaches at least 50% of maximum dopant concentration at least 5 nm below the top surface of the each of the set of semiconductor segments.

3. An integrated circuit (IC) comprising a first plurality of transistors, wherein each of the first plurality of transistors comprises:

a source;

a drain;

a channel region between the source and the drain; and a gate over the channel region, wherein the channel region comprises a set of semiconductor segments connecting the source and the drain, and wherein a centerline of a first one of the set of semiconductor segments in each of the plurality of transistors is aligned with a first common centerline, wherein each of the first plurality of transistors further comprises:

a set of gate dielectrics, each of the set of gate dielectrics covering a top surface of one of the set of semiconductor segments; and a gate over the set of semiconductor segments, wherein the gate is separated from the set of semiconductor segments by the set of gate dielectrics, wherein each of the set of gate dielectrics in each of the first plurality of transistors extends down both sides of one of the set of semiconductor segments in the each of the first plurality of transistors by a first distance, wherein the gate in each of the first plurality of transistors extends down both sides of each of the set of semiconductor segments in the each of the first plurality of transistors by the first distance, wherein the each of the set of semiconductor segments in the each of the first plurality of transistors includes a sub-surface heavily doped region, and wherein the sub-surface heavily doped region in the each of the set of semiconductor segments in the each of the first plurality of transistors reaches at least 50% of maximum dopant concentration below the first distance below the top surface of the each of the set of semiconductor segments.

4. An integrated circuit (IC) comprising a first plurality of transistors, wherein each of the first plurality of transistors comprises:

a source;

a drain;

a channel region between the source and the drain; and a gate over the channel region, wherein the channel region comprises a set of semiconductor segments connecting the source and the drain, and wherein a centerline of a first one of the set of semiconductor segments in each of the plurality of transistors is aligned with a first common centerline, wherein the source in each of the first plurality of transistors comprises a first region doped to a first depth beneath a top surface of each of the set of semiconductor segments, wherein the drain in each of the first plurality of transistors comprises a second region doped to a second depth beneath the top surface of each of the set of semiconductor segments, wherein the channel region further comprises insulation material separating the set of semiconductor segments, the insulation material reaching a third depth beneath the top surface of each of the set of semiconductor segments, wherein the third depth is less than the first depth and the second depth.

5. An integrated circuit (IC) comprising a first plurality of transistors, wherein each of the first plurality of transistors comprises:

a source;

a drain;

a channel region between the source and the drain; and a gate over the channel region, wherein the channel region comprises a set of semiconductor segments connecting the source and the drain, wherein a centerline of a first one of the set of semiconductor segments in each of the plurality of transistors is aligned with a first common centerline, wherein the source in each of the first plurality of transistors comprises a first region doped to a first depth beneath a top surface of each of the set of semiconductor segments, wherein the drain in each of the first plurality of transistors comprises a second region doped to a second depth beneath the top surface of each of the set of semiconductor segments, and wherein the channel region further comprises insulation material separating the set of semiconductor segments, the insulation material reaching a third depth beneath the top surface of each of the set of semiconductor segments, wherein the third depth is greater than the first depth and the second depth.

6. An integrated circuit (IC) comprising a first plurality of transistors, wherein each of the first plurality of transistors comprises:

a source;

a drain;

a channel region between the source and the drain; and a gate over the channel region, wherein the channel region comprises a set of semiconductor segments connecting the source and the drain, and wherein a centerline of a first one of the set of semiconductor segments in each of the plurality of transistors is aligned with a first common centerline, wherein each of the first plurality of transistors further comprises a first sidewall spacer and a second sidewall spacer on either side of the gate, wherein the source comprises a first extension under the first sidewall spacer, and wherein the drain comprises a second extension under the second sidewall spacer.

7. An integrated circuit (IC) comprising a first plurality of transistors, wherein each of the first plurality of transistors comprises:

a source;

a drain;

a channel region between the source and the drain; and a gate over the channel region, wherein the channel region comprises a set of semiconductor segments connecting the source and the drain, wherein a centerline of a first one of the set of semiconductor segments in each of the plurality of transistors is aligned with a first common centerline, wherein a first one of the plurality of transistors comprises a PMOS transistor, wherein a second one of the plurality of transistors comprises an NMOS transistor, wherein each of a first set of semiconductor segments in a first channel region of the PMOS transistor comprises a first silicon layer having an (110) surface crystalline orientation, and wherein each of a second set of semiconductor segments in a second channel region of the NMOS transistor comprises a second silicon layer having an (001) surface crystalline orientation.

8. A semiconductor substrate comprising:

a first plurality of parallel semiconductor ridges formed on a bulk substrate; and a plurality of die locations, wherein each of the first plurality of parallel semiconductor ridges has a first height and a first width, and wherein the first plurality of parallel semiconductor ridges are equally spaced by a first spacing, wherein each of the plurality of die locations includes a first set of parallel semiconductor ridges, each of the first set of parallel semiconductor ridges having the first height, the first width, and the first spacing from adjacent ones of the first set of parallel ridges, wherein each of the first set of parallel semiconductor ridges includes a first ridge grouping and a second ridge grouping, wherein each of the parallel semiconductor ridges in the first ridge grouping has a first composition, and wherein each of the parallel semiconductor ridges in the second ridge grouping has a second composition, the second composition being different from the first composition.

9. A semiconductor substrate comprising:
a first plurality of parallel semiconductor ridges formed on a bulk substrate; and
a plurality of die locations,
wherein each of the first plurality of parallel semiconductor ridges has a first height and a first width, and
wherein the first plurality of parallel semiconductor ridges are equally spaced by a first spacing,
wherein each of the plurality of die locations includes a first set of parallel semiconductor ridges, each of the first set of parallel semiconductor ridges having the first height, the first width, and the first spacing from adjacent ones of the first set of parallel ridges,
wherein each of the first set of parallel semiconductor ridges includes a first ridge grouping and a second ridge grouping,
wherein each of the parallel semiconductor ridges in the first ridge grouping comprises a silicon layer having a (110) surface crystalline orientation, and
wherein each of the parallel semiconductor ridges in the second ridge grouping comprises a silicon layer having a (001) surface crystalline orientation.

10. A semiconductor substrate comprising:
a first plurality of parallel semiconductor ridges formed on a bulk substrate; and
a plurality of die locations,
wherein each of the first plurality of parallel semiconductor ridges has a first height and a first width, and
wherein the first plurality of parallel semiconductor ridges are equally spaced by a first spacing,
wherein each of the plurality of die locations includes a first set of parallel semiconductor ridges, each of the first set of parallel semiconductor ridges having the first height, the first width, and the first spacing from adjacent ones of the first set of parallel ridges,
wherein each of the plurality of die locations includes a second set of parallel semiconductor ridges,
wherein each of the second plurality of parallel semiconductor ridges has a second height and a second width, and
wherein the second plurality of parallel semiconductor ridges are equally spaced by a second spacing.

11. A semiconductor substrate comprising:
a first plurality of parallel semiconductor ridges formed on a bulk substrate; and
a plurality of die locations,
wherein each of the first plurality of parallel semiconductor ridges has a first height and a first width, and
wherein the first plurality of parallel semiconductor ridges are equally spaced by a first spacing,
wherein each of the plurality of die locations includes a first set of parallel semiconductor ridges, each of the first set of parallel semiconductor ridges having the first height, the first width, and the first spacing from adjacent ones of the first set of parallel ridges,
wherein each of the first set of parallel semiconductor ridges comprises a first semiconductor material layer formed on a second semiconductor material layer.

12. A semiconductor substrate comprising:
a first plurality of parallel semiconductor ridges formed on a bulk substrate; and
a plurality of die locations,
wherein each of the first plurality of parallel semiconductor ridges has a first height and a first width, and
wherein the first plurality of parallel semiconductor ridges are equally spaced by a first spacing,
wherein each of the plurality of die locations includes a first set of parallel semiconductor ridges, each of the first set of parallel semiconductor ridges having the first height, the first width, and the first spacing from adjacent ones of the first set of parallel ridges,
wherein the first set of parallel semiconductor ridges is formed on an insulation layer in the bulk substrate.

13. A semiconductor substrate comprising:
a first plurality of parallel semiconductor ridges formed on a bulk substrate; and
a plurality of die locations,
wherein each of the first plurality of parallel semiconductor ridges has a first height and a first width, and
wherein the first plurality of parallel semiconductor ridges are equally spaced by a first spacing,
wherein each of the plurality of die locations includes a first set of parallel semiconductor ridges, each of the first set of parallel semiconductor ridges having the first height, the first width, and the first spacing from adjacent ones of the first set of parallel ridges,
wherein each of the plurality of die locations further includes at least one planar region.

14. A semiconductor substrate comprising:
a first plurality of parallel semiconductor ridges formed on a bulk substrate;
a ridge insulator material between each of the first plurality of semiconductor ridges; and
a plurality of die locations,
wherein each of the first plurality of parallel semiconductor ridges has a first height and a first width, and
wherein the first plurality of parallel semiconductor ridges are equally spaced by a first spacing,
wherein each of the plurality of die locations includes a first set of parallel semiconductor ridges, each of the first set of parallel semiconductor ridges having the first height, the first width, and the first spacing from adjacent ones of the first set of parallel ridges.

* * * * *